(12) United States Patent
Chung et al.

(10) Patent No.: US 10,770,160 B2
(45) Date of Patent: Sep. 8, 2020

(54) PROGRAMMABLE RESISTIVE MEMORY FORMED BY BIT SLICES FROM A STANDARD CELL LIBRARY

(71) Applicant: Attopsemi Technology Co., LTD, Hsinchu (TW)

(72) Inventors: Shine C. Chung, San Jose, CA (US); Koji Nii, Tokyo (JP)

(73) Assignees: Attopsemi Technology Co., LTD, Hsinchu (TW); Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/191,429

(22) Filed: Nov. 14, 2018

(65) Prior Publication Data

US 2019/0164619 A1 May 30, 2019

Related U.S. Application Data

(60) Provisional application No. 62/592,410, filed on Nov. 30, 2017.

(51) Int. Cl.
*G11C 7/10* (2006.01)
*G11C 17/16* (2006.01)
*G11C 17/18* (2006.01)
*G06F 30/392* (2020.01)
*G06F 30/398* (2020.01)

(52) U.S. Cl.
CPC ............ *G11C 17/16* (2013.01); *G06F 30/392* (2020.01); *G11C 17/18* (2013.01); *G06F 30/398* (2020.01)

(58) Field of Classification Search
CPC ........ G11C 7/16; G11C 17/18; G06F 17/5072
USPC ........................................................ 365/96
See application file for complete search history.

(56) References Cited

U.S. PATENT DOCUMENTS

| | | | |
|---|---|---|---|
| 3,198,670 | A | 8/1965 | Nissim |
| 3,715,242 | A | 2/1973 | Daniel |
| 4,148,046 | A | 4/1979 | Hendrickson et al. |
| 4,192,059 | A | 3/1980 | Khan et al. |
| 4,642,674 | A | 2/1987 | Schoofs |
| 4,879,689 | A | 11/1989 | Atsumi |
| 5,192,989 | A | 3/1993 | Matsushita et al. |
| 5,355,342 | A | 10/1994 | Ueoka |
| 5,389,552 | A | 2/1995 | Iranmanesh |
| 5,447,876 | A | 9/1995 | Moyer et al. |

(Continued)

FOREIGN PATENT DOCUMENTS

| | | | |
|---|---|---|---|
| CN | 1469473 A | | 1/2004 |
| CN | 1691204 A | | 11/2005 |

(Continued)

OTHER PUBLICATIONS

U.S. Appl. No. 13/471,704, filed May 15, 2012.

(Continued)

*Primary Examiner* — Xiaochun L Chen

(57) ABSTRACT

Architecture, design, structure, layout, and method of forming a Programmable Resistive Device (PRD) memory in standard cell library are disclosed. The PRD memory has a plurality of PRD cells. At least one of the PRD cells can have a PRD element coupled to a first supply voltage line and coupled to a second supply voltage line through a program selector. The PRD cells reside in a standard cell library and following most of the standard cell design and layout guidelines.

20 Claims, 13 Drawing Sheets

(56) References Cited

U.S. PATENT DOCUMENTS

| | | |
|---|---|---|
| 5,536,968 A | 7/1996 | Crafts |
| 5,548,225 A | 8/1996 | Rountree |
| 5,600,588 A | 2/1997 | Kawashima |
| 5,610,871 A | 3/1997 | Hidaka |
| 5,635,742 A | 6/1997 | Hoshi et al. |
| 5,637,901 A | 6/1997 | Beigel et al. |
| 5,723,890 A | 3/1998 | Fujihira et al. |
| 5,747,805 A | 5/1998 | Youngquist |
| 5,757,046 A | 5/1998 | Fujihira et al. |
| 5,761,148 A | 6/1998 | Allan et al. |
| 5,962,903 A | 10/1999 | Sung et al. |
| 5,973,900 A | 10/1999 | Sher |
| 6,002,156 A | 12/1999 | Lin |
| 6,008,092 A | 12/1999 | Gould |
| 6,034,882 A | 3/2000 | Johnson et al. |
| 6,054,344 A | 4/2000 | Liang et al. |
| 6,108,247 A | 8/2000 | Suzu |
| 6,140,687 A | 10/2000 | Shimormura et al. |
| 6,215,681 B1 | 4/2001 | Schuurman |
| 6,222,244 B1 | 4/2001 | Arndt et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,388,292 B1 | 5/2002 | Lin |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,728,137 B1 | 4/2004 | Lin |
| 6,731,535 B1 | 5/2004 | Ooishi et al. |
| 6,770,953 B2 | 8/2004 | Boeck et al. |
| 6,798,684 B2 | 9/2004 | Low et al. |
| 6,803,804 B2 | 10/2004 | Madurawe |
| 6,813,705 B2 | 11/2004 | Duesterwald et al. |
| 6,897,543 B1 | 5/2005 | Huang et al. |
| 6,934,176 B2 | 8/2005 | Low et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,102,951 B2 | 9/2006 | Paillet et al. |
| 7,167,397 B2 | 1/2007 | Paillet et al. |
| 7,211,843 B2 | 5/2007 | Low et al. |
| 7,212,432 B2 | 5/2007 | Ferrant et al. |
| 7,224,598 B2 | 5/2007 | Perner |
| 7,263,027 B2 | 8/2007 | Kim et al. |
| 7,294,542 B2 | 11/2007 | Okushima |
| 7,369,452 B2 | 5/2008 | Kenkare et al. |
| 7,391,064 B1 | 6/2008 | Tripsas et al. |
| 7,405,590 B1 | 7/2008 | Kaneko |
| 7,411,844 B2 | 8/2008 | Nitzan et al. |
| 7,439,608 B2 | 10/2008 | Arendt |
| 7,450,414 B2 | 11/2008 | Scheuerlein |
| 7,461,371 B2 | 12/2008 | Luo et al. |
| 7,573,762 B2 | 8/2009 | Kenkare et al. |
| 7,579,232 B1 | 8/2009 | Ping |
| 7,589,367 B2 | 9/2009 | Oh et al. |
| 7,609,578 B2 | 10/2009 | Buer et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,759,766 B2 | 7/2010 | Booth |
| 7,764,532 B2 | 7/2010 | Kurjanowicz et al. |
| 7,772,591 B1 | 8/2010 | Shih et al. |
| 7,802,057 B2 | 9/2010 | Iyer et al. |
| 7,808,815 B2 | 10/2010 | Ro et al. |
| 7,830,697 B2 | 10/2010 | Herner |
| 7,833,823 B2 | 11/2010 | Klersy |
| 7,834,659 B1 | 11/2010 | Im et al. |
| 7,852,656 B2 | 12/2010 | Shin et al. |
| 7,859,920 B2 | 12/2010 | Jung |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,154,005 B2 | 4/2012 | Hsia |
| 8,168,538 B2 | 5/2012 | Chen et al. |
| 8,174,063 B2 | 5/2012 | Liu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,203,899 B2 | 6/2012 | Chen |
| 8,217,490 B2 | 7/2012 | Bertin et al. |
| 8,233,316 B2 | 7/2012 | Liu et al. |
| 8,339,079 B2 | 12/2012 | Yamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,503,141 B2 | 8/2013 | Mallikarjunaswamy |
| 8,514,606 B2 | 8/2013 | Chung |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,598,639 B2 | 12/2013 | Hsin |
| 8,607,019 B2 * | 12/2013 | Chung ................ G06F 17/5045 707/802 |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,680,620 B2 | 3/2014 | Salcedo et al. |
| 8,699,259 B2 | 4/2014 | Zhang et al. |
| 8,760,904 B2 | 6/2014 | Chung |
| 8,804,398 B2 | 8/2014 | Chung |
| 8,817,563 B2 | 8/2014 | Chung |
| 8,830,720 B2 | 9/2014 | Chung |
| 8,848,423 B2 | 9/2014 | Chung |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,070 B2 | 12/2014 | Xia |
| 8,923,085 B2 * | 12/2014 | Chung ................ G11C 17/16 365/148 |
| 8,929,122 B2 | 1/2015 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 9,070,437 B2 | 6/2015 | Chung |
| 9,178,100 B2 | 11/2015 | Webster |
| 9,236,141 B2 | 1/2016 | Chung |
| 9,281,038 B2 | 3/2016 | Chung |
| 9,305,973 B2 | 4/2016 | Chung |
| 9,324,447 B2 | 4/2016 | Chung |
| 9,324,849 B2 | 4/2016 | Chung |
| 9,343,176 B2 * | 5/2016 | Chung ................ G11C 17/16 |
| 9,449,687 B1 | 9/2016 | Piccardi |
| 9,460,807 B2 | 10/2016 | Chung |
| 9,478,306 B2 | 10/2016 | Chung |
| 9,548,109 B2 | 1/2017 | Chung |
| 9,548,131 B1 | 1/2017 | Bill |
| 9,767,915 B2 | 9/2017 | Chung |
| 9,818,478 B2 | 11/2017 | Chung |
| 9,838,025 B1 | 12/2017 | Deng |
| 9,852,783 B1 | 12/2017 | Na |
| 9,981,970 B2 | 1/2018 | Chung |
| 10,192,615 B2 | 1/2019 | Chung |
| 2002/0018355 A1 | 2/2002 | Johnson et al. |
| 2002/0042636 A1 | 4/2002 | Koshiol |
| 2002/0075744 A1 | 6/2002 | McCollum |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |

(56) References Cited

U.S. PATENT DOCUMENTS

| | | |
|---|---|---|
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0013162 A1 | 1/2005 | Jeon |
| 2005/0052915 A1 | 3/2005 | Herner |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 | 11/2005 | Ang |
| 2006/0067099 A1 | 3/2006 | Kim |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2006/0285385 A1 | 12/2006 | Kuo |
| 2007/0004160 A1 | 1/2007 | Voldman |
| 2007/0008776 A1 | 1/2007 | Scheuerlein et al. |
| 2007/0030026 A1 | 2/2007 | Hsu et al. |
| 2007/0057323 A1 | 3/2007 | Furukawa et al. |
| 2007/0058422 A1 | 3/2007 | Phillips |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0183213 A1 | 8/2007 | Kusakabe |
| 2007/0218665 A1 | 9/2007 | Sutardja |
| 2007/0223266 A1 | 9/2007 | Chen |
| 2007/0279978 A1 | 12/2007 | Ho et al. |
| 2007/0284656 A1 | 12/2007 | Radigan |
| 2008/0025067 A1 | 1/2008 | Scheuerlein et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0137401 A1 | 6/2008 | Philipp |
| 2008/0144354 A1 | 6/2008 | Choi |
| 2008/0151612 A1 | 6/2008 | Pellizzer et al. |
| 2008/0170429 A1 | 7/2008 | Bertin et al. |
| 2008/0175060 A1 | 7/2008 | Liu et al. |
| 2008/0185568 A1 | 8/2008 | Kwon |
| 2008/0205115 A1 | 8/2008 | Ho |
| 2008/0220560 A1 | 9/2008 | Klersy |
| 2008/0225567 A1 | 9/2008 | Burr et al. |
| 2008/0280401 A1 | 11/2008 | Burr et al. |
| 2008/0316852 A1 | 12/2008 | Matsufuji et al. |
| 2009/0039420 A1 | 2/2009 | Trivedi |
| 2009/0055617 A1 | 2/2009 | Bansal et al. |
| 2009/0115021 A1 | 5/2009 | Moriwaki |
| 2009/0141573 A1 | 6/2009 | Hsueh |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0251943 A1 | 10/2009 | Kurjanowicz |
| 2009/0269932 A1 | 10/2009 | Chen |
| 2009/0273964 A1 | 11/2009 | Yamazaki |
| 2009/0296933 A1 | 12/2009 | Akselrod |
| 2009/0309089 A1 | 12/2009 | Hsia et al. |
| 2010/0002501 A1 | 1/2010 | Leuschner |
| 2010/0027326 A1 | 2/2010 | Kim et al. |
| 2010/0034016 A1 | 2/2010 | Liu et al. |
| 2010/0061136 A1 | 3/2010 | Koyama et al. |
| 2010/0080035 A1 | 4/2010 | Venkatraman |
| 2010/0085798 A1 | 4/2010 | Lu et al. |
| 2010/0091546 A1 | 4/2010 | Liu et al. |
| 2010/0103721 A1 | 4/2010 | Guha |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0177547 A1 | 7/2010 | Shen |
| 2010/0201410 A1 | 8/2010 | Illegems |
| 2010/0219392 A1 | 9/2010 | Awaya |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0250974 A1 | 9/2010 | Ristic |
| 2010/0271064 A1 | 10/2010 | Kohler |
| 2010/0277967 A1 | 11/2010 | Lee et al. |
| 2010/0301304 A1 | 12/2010 | Chen et al. |
| 2010/0301926 A1 | 12/2010 | Dell |
| 2010/0321976 A1 | 12/2010 | Jung |
| 2011/0022648 A1 | 1/2011 | Harris et al. |
| 2011/0051491 A1 | 3/2011 | Takizawa |
| 2011/0062557 A1 | 3/2011 | Bandyopadhyay et al. |
| 2011/0108926 A1 | 5/2011 | Bahl |
| 2011/0127627 A1 | 6/2011 | Hoofman |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0186990 A1 | 8/2011 | Mawatari |
| 2011/0222330 A1 | 9/2011 | Lee et al. |
| 2011/0235388 A1 | 9/2011 | Nakano |
| 2011/0260289 A1 | 10/2011 | Oyamada |
| 2011/0267869 A1 | 11/2011 | Hoefler |
| 2011/0286261 A1 | 11/2011 | Sakuguchi |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0120707 A1 | 5/2012 | Kim |
| 2012/0147653 A1 | 6/2012 | Chung |
| 2012/0147657 A1 | 6/2012 | Sekar et al. |
| 2012/0182783 A1 | 7/2012 | Bedeschi |
| 2012/0209888 A1* | 8/2012 | Chung ............ G06F 17/5045 707/802 |
| 2012/0224406 A1 | 9/2012 | Chung |
| 2012/0224413 A1 | 9/2012 | Zhang et al. |
| 2012/0256292 A1 | 10/2012 | Yu et al. |
| 2012/0257435 A1 | 10/2012 | Lin |
| 2012/0268980 A1 | 10/2012 | Awaya |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0006559 A1 | 1/2013 | Grosjean |
| 2013/0135503 A1 | 5/2013 | Park |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |

(56) References Cited

U.S. PATENT DOCUMENTS

| | | |
|---|---|---|
| 2013/0235644 A1 | 9/2013 | Chung |
| 2013/0268526 A1 | 10/2013 | John et al. |
| 2013/0268727 A1 | 10/2013 | Sohn |
| 2013/0286710 A1 | 10/2013 | Hall |
| 2013/0294136 A1 | 11/2013 | Siau |
| 2013/0307821 A1 | 11/2013 | Kogo |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0071751 A1 | 3/2014 | Kim |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1* | 7/2014 | Chung ............... G11C 17/16 365/185.18 |
| 2014/0211577 A1 | 7/2014 | Ryu |
| 2014/0269135 A1 | 9/2014 | Chung |
| 2014/0340954 A1* | 11/2014 | Chung ............... G11C 17/16 365/96 |
| 2014/0369133 A1 | 12/2014 | Lee et al. |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |
| 2015/0130509 A1 | 5/2015 | Herner |
| 2015/0137258 A1 | 5/2015 | Mittal |
| 2015/0187414 A1 | 7/2015 | Perner |
| 2015/0194433 A1 | 7/2015 | Ponoth |
| 2015/0206586 A1 | 7/2015 | Chang |
| 2015/0249428 A1 | 9/2015 | Huynh |
| 2015/0276500 A1 | 10/2015 | Walker |
| 2015/0326129 A1 | 11/2015 | Lin |
| 2015/0380103 A1 | 12/2015 | Braun et al. |
| 2016/0003880 A1 | 1/2016 | Deschildre |
| 2016/0034351 A1 | 2/2016 | Michael |
| 2016/0035423 A1 | 2/2016 | Nam |
| 2016/0071582 A1 | 3/2016 | Chung |
| 2016/0078919 A1 | 3/2016 | Han |
| 2016/0149586 A1 | 5/2016 | Roh |
| 2016/0247580 A1 | 8/2016 | Chen |
| 2016/0268002 A1 | 9/2016 | Chen |
| 2016/0276043 A1 | 9/2016 | Chung |
| 2016/0329810 A1 | 11/2016 | Lee et al. |
| 2016/0336062 A1 | 11/2016 | Buchanan |
| 2016/0358648 A1 | 12/2016 | Park |
| 2017/0053708 A1 | 2/2017 | Wong |
| 2017/0053716 A1 | 2/2017 | Kim |
| 2017/0076733 A1 | 3/2017 | Noguchi |
| 2017/0103699 A1 | 4/2017 | Lin |
| 2017/0110170 A1 | 4/2017 | Kong |
| 2017/0110512 A1 | 4/2017 | Chung |
| 2017/0149395 A1 | 5/2017 | Patel |
| 2017/0178745 A1 | 6/2017 | Chen |
| 2017/0199537 A1 | 7/2017 | Duong |
| 2017/0271005 A1 | 9/2017 | Renane |
| 2017/0316834 A1 | 11/2017 | Huynh |
| 2017/0364276 A1 | 12/2017 | Bhuiyan |
| 2017/0365360 A1 | 12/2017 | Fackenthal |
| 2018/0005703 A1 | 1/2018 | Nguyen |
| 2018/0059958 A1 | 3/2018 | Ryan |
| 2018/0075906 A1 | 3/2018 | Chung |
| 2018/0095489 A1 | 4/2018 | Fang |
| 2018/0097447 A1 | 4/2018 | Iorio |
| 2018/0122817 A1 | 5/2018 | Ramaswamy |
| 2018/0204512 A1 | 7/2018 | Han |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| CN | 10238593 A | 3/2012 |
| CN | 102385932 A | 3/2012 |
| CN | 10261027 A | 7/2012 |
| CN | 102610272 A | 7/2012 |
| EP | 1367596 A1 | 12/2003 |
| JP | 03-264814 | 11/1991 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun., 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p. Diodes: Effect of the Grain boundaries and of the p-Implemented Doping Level on the I-V and C-V Characteristics," Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. On Elec. Dev., vol. 41, No. 2, Feb, 1994, pp. 204-211.
Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.

(56) References Cited

OTHER PUBLICATIONS

Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. On Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.
Bedeschi, F. et al., "Set and Reset Pulse Characterization in BJT-Selected Phase-Change Memory," IEEE Int. Symp. On Circuits and Systems (ISCAS), 2005, pp. 1270-1273.
Braganca, P. M. et al., "A Three-Terminal Approach to Developing Spin-Torque Written Magnetic Random Access Memory Cells," IEEE Trans. on Nano. vol., 8, No. 2, Mar. 2009, pp. 190-195.
Cagli, C. et al., "Evidence for threshold switching in the set process of NiO-based RRAM and physical modeling for set, reset, retention and disturb prediction," IEEE IEDM, 2008, pp. 1-4.
Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.
Chan, Wan Tim, et al., "CMOS Compatible Zero-Mask One Time Programmable Memory Design", Master Thesis, Hong-Kong University of Science and Technologies, 2008.
Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.
Cheng, Yu-Hsing et al., "Failure Analysis and Optimization of Metal Fuses for Post Package Trimming," IEEE 45th IRPS, 2007, pp. 616-617.
Chiu, Pi-Feng et al., "A Low Store Energy, Low VDDmin, Non-volatile 8T2R SRAM with 3D Stacked RRAM Devices for Low Power Mobile Applications," IEEE VLSI Cir./Tech Symp., Jun. 2010, pp. 229-230.
Cho, Woo Yeong et al., "A 0.18um 3.0V 64Mb Non-Volatile Phase-Transition Random-Access Memory (PRAM)," ISSCC, Feb. 2004, Sec. 2-1.
Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.
Choi, Youngdon et al., "A 20nm 1.8V 8Gb PRAM with 40MB/s Program Bandwidth," IEEE ISSCC, 2012, pp. 46-47.
Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.
Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.
Crowley, Matthew et al., "512Mb PROM with 8 Layers of Antifuse/Diode Cells," IEEE ISSCC 2003, Sec. 16.4.
De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.
De Sandre, Guido et al., "A 90nm 4Mb Embedded Phase-Change Memory with 1.2V 12ns Read Access Time and 1MB/s Write Throughput," ISSCC 2010, Sec. 14.7.
Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.
Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.
Dion, Michael J., "Reservoir Modeling for Electromigration Improvement of Metal Systems with Refractory Barriers," IEEE 39th IRPS, 2001, pp. 327-333.
Doorn, T. S. et al., "Ultra-fast Programming of Silicided Polysilicon Fuses Based on New Insights in the Programming Physics," IEEE IEDM, 2005, pp. 667-670.
Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.
Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.
Engel, B. et al., "The Science and Technology of Magnetoresistive Tunnel Memory," IEEE Tran. on Nanotechnology, vol. 1, No. 1, Mar. 2002, pp. 32-38.
Engel, B.N. et al., "A 4Mb Toggle MRAM Based on a Novel bit and Switching Method," IEEE Trans. on Mag. vol. 41, No. 1, Jan. 2005, pp. 132-136.
Fellner, Johannes, et al., "Lifetime Study for a Poly Fuse in a 0.35um Polycide CMOS Process," IEEE 43rd IRPS, 2005, pp. 446-449.
Gao, B. et al., "Oxide-Based RRAM: Uniformity Improvement Using a New Material-Oriented Methodology," IEEE VLSI Tech. Symp., Jun. 2009, pp. 30-31.
Gao, B. et al., "Oxide-Based RRAM Switching Mechanism: A New Ion-Transport-Recombination Model," IEDM, Dec. 2008, pp. 563-566.
Gill, M. et al., "Ovonic Unified Memory-A High Performance Nonvolatile Memory Technology for Stand-Alone Memory and Embedded Applications," IEEE, ISSCC Dig. of Tech. Paper, Feb. 2002, pp. 202-203.
Gogl, D. et al., "A 16-Mb MRAM Featuring Bootstrapped Write Drivers," IEEE J. of Solid-State Circuits, vol. 40, No. 4, Apr. 2005, pp. 902-908.
Gopalan, C. et al., Demonstration of Conductive Bridging Random Access Memory (CBRAM) in Logic CMOS Process, IEEE Int. Memory Workshop, 2010, pp. 1-4.
Ha, Daewon and Kim, Kinam, "Recent Advances in High Density Phase Change Memory (PRAM)," IEEE VLSI Tech. Symp. Jun. 2007.
Hosoi, Y. et al., "High Speed Unipolar Switching Resistance RAM (RRAM) Technology," IEEE IEDM, Dec. 2006, pp. 1-4.
Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.
Huang, Chia-En et al., "A New CMOS Logic Anti-Fuse Cell with Programmable Contact," IEEE IEDM Tech. Dig. 2007, pp. 48-51.
Im, Jay et al., "Characterization of Silicided Polysilicon Fuse Implemented in 65nm CMOS Technology,"7th Annual Non-Volatile Memory Technology Symp, (NVMTS) 2006, pp. 55-57.
Jin, Li-Yan et al., "Low-Area 1-Kb Multi-Bit OTP IP Design," IEEE 8th Int. Conf. on ASIC (ASICON), 2009. pp. 629-632.
Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.
Kalnitsy, Alexander et al., "CoSi2 Integrated Fuses on Poly Silicon for Low Voltage 0.18um CMOS Applications," IEEE IEDM 1999, pp. 765-768.
Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.

(56) References Cited

OTHER PUBLICATIONS

Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.

Kim, Deok-Kee et al., "An Investigation of Electrical Current Induced Phase Transitions in the NiPtSi/Polysilicon System," J. App. Phy. 103, 073708 (2008).

Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.

Kim, Jinbong et al., "3-Transistor Antifuse OTP ROM Array Using Standard CMOS Process," IEEE VLSI Cir. Symposium, Jun. 2003, pp. 239-242.

Kim, O. et al., "CMOS trimming circuit based on polysilicon fusing," Elec. Lett. vol. 34, No. 4, pp. 355-356, Feb. 1998.

Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.

Kothandaramam, C. et al., "Electrically programmable fuse (eFUSE) using.electromigration in silicides," IEEE Elec. Dev. Lett., vol. 23, No. 9, pp. 523-525, Sep. 2002.

Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.

Kulkarni, S. et al., Programmable 1.37um2 "A 4Kb Metal-Fuse OTP-ROM Macro Featuring a 2V 1T1R Bit Cell in 32nm High-K Metal-Gate CMOS," IEEE J. of Sol. Stat. Cir, vol. 45, No. 4, Apr. 2010, pp. 863-868.

Kund, Michael et al., "Conductive Bridging RAM (CBRAM): An Emerging Non-Volatile Memory Technology Scalable to Sub 20nm," IEEE IEDM 2005, pp. 754-757.

Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.

Lai, S., "Current Status of the Phase Change Memory and Its Future," IEEE IEDM Dig. of Tech. Paper, Dec. 2003, pp. 255-258.

Lee, H. Y. et al., "Low Power and High Speed Bipolar Switching with a Thin Reactive Ti Buffer Layer in Robust HfO2 Based RRAM," IEEE IEDM, 2008, pp. 1-4.

Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.

Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.

Lee, M.-J. et al., "Stack Friendly all-Oxide 3D RRAM Using GaInZnO Peripheral TFT Realized Over Glass Substrates," IEDM, Dec. 2008. pp. 1-4.

Lee, Man Chiu et al., "OTP Memory for Low Cost Passive RFID Tags," IEEE Conf. on Electron Devices and Solid-State Circuits (EDSSC), 2007, pp. 633-636.

Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.

Lim, Kyunam et al., "Bit Line Coupling Scheme and Electrical Fuse Circuit for Reliable Operation of High Density DRAM," IEEE VLSI Cir. Symp. Jun. 2001, pp. 33-34.

Maffitt, T. et al., "Design Considerations for MRAM," IBM J. Res. & Dev., vol. 50, No. 1, Jan. 2006, pp. 25-39.

Meng, X.Z. et al., "Reliability Concept for Electrical Fuses," IEE Proc.-Sci Meas. Technol., vol. 144, No. 2, Mar. 1997, pp. 87-92.

Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.

Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.

Morimoto, T. et al., "A NiSi Salicide Technology for Advanced Logic Devices," IEEE IEDM, Dec. 1991, pp. 653-656.

Neale, Ron, "PCm Progress Report No. 6 Afterthoughts," http://www.eetimes.com/General/PrintView/4236240, Feb. 13, 2012, 5 pages.

Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.

Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.

Oh, G. H. et al., "Parallel Multi-Confined (PMC) Cell Technology for High Density MLC PRAM," IEEE VLSI Tech. Symp., Jun. 2009, pp. 220-221.

Oh, J. H. et al., "Full Integration of Highly Manufacturable 512Mb PRAM Based on 90nm Technology," IEEE IEDM Dig. of Tech. Paper, Dec. 2006, pp. 1-4.

Osada, K. et al., "Phase Change RAM Operated with 1.5V CMOS as Low Cost Embedded Memory," IEEE Cicc, Nov. 2005, pp. 431-434.

Park, Don et al., "Study on Reliability of Metal Fuse for Sub-100nm Technology," IEEE Int. Symp. On Semiconductor Manufacturing (ISSM), 2005, pp. 420-421.

Park, Jongwoo et al., "Phase Transformation of Programmed NiSi Electrical Fuse: Diffusion, Agglomeration, and Thermal Stability," 18th IEEE Int. Symp. On Physical and Failure Analysis of Integrated Circuits, (IPFA), 2011, pp. 1-7.

Park, Young-Bae et al., "Design of an eFuse OTP Memory of 8 Bits Based on a 0.35um BCD Process," Mobile It Convergence (ICMIC), 2011 Int. Conf. on, pp. 137-139.

Pellizzer, F. et al., "Novel uTrench Phase-Change Memory Cell for Embedded and Stand-alone Non-Volatile Memory Applications," IEEE VLSI Tech Symp. Jun. 2004, pp. 18-19.

Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.

Rizzolo, R. F. et al., "IBM System z9 eFUSE applications and methodology," IBM J. Res. & Dev. vol. 51 No. ½ Jan./Mar. 2007, pp. 65-75.

Robson, Norm et al., "Electrically Programmable Fuse (eFuse) from Memory Redundancy to Autonomic Chips," IEEE CICC, 2007, pp. 799-804.

Russo, U. et al., "Conductive-Filament Switching Analysis and Self-Accelerated Thermal Dissolution Model for Reset in NiO-based RRAM," IEDM, Dec. 2007, pp. 775-778.

Safran, J. et al., "A Compact eFUSE Programmable Array Memory for SOI CMOS," VLSI Cir. Symp. Jun. 2007, pp. 72-73.

Sasaki, Takahiko et al., "Metal-Segregate-Quench Programming of Electrical Fuse," IEEE 43rd IRPS, 2005, pp. 347-351.

Schrogmeier, P. et al., "Time Discrete Voltage Sensing and Iterative Programming Control for a 4F2 Multilevel CBRAM," VLSI Cir. Symp., Jun. 2007, pp. 186-187.

Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.

Sheu, Shyh-Shyuan et al., "Fast-Write Resistive RAM (RRAM) for Embedded Applications," IEEE Design & Test of Computers, Jan./Feb. 2011, pp. 64-71.

Shi, Min et al., "Zero-Mask Contact Fuse for One-Time-Programmable Memory in Standard CMOS Processes," IEEE Dev. Lett. vol. 32, No. 7, Jul. 2011, pp. 955-957.

Song, Y. J. et al., "Highly Reliable 256Mb PRAM with Advanced Ring Contact Technology and Novel Encapsulating Technology," IEEE VLSI Tech Symp., Jun. 2006, pp. 153-154.

(56) References Cited

OTHER PUBLICATIONS

Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIrw Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Different Programming Mechanisms," Investigation of NiPtSi Electrical Fuse with IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/Session 22/Variation Compensation and Measurement/ 22.4, 2008 IEEE International Solid- State Circuits Conference, pp. 406-407.
Vimercati, Daniele et al., "A 45nm 1Gbit 1.8V PCM for Wireless and Embedded Applications," IEEE ISSCC Feb., 2010, 26 pages.
Vinson, J. E., "NiCr Fuse Reliability—A New Approach," Southcon/ 94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. Of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 dated Sep. 18, 2012.
Office Action for U.S. Appl. No. 13/471,704 dated Jul. 31, 2012.
Notice of Allowance for U.S. Appl. No. 13/471,704 dated Oct. 18, 2012.
Notice of Allowance for U.S. Appl. No. 13/026,678 dated Sep. 19, 2012.
Office Action for U.S. Appl. No. 13/026,783 dated Sep. 27, 2012.
Office Action for U.S. Appl. No. 13/026,717 dated Oct. 25, 2012.
Office Action for U.S. Appl. No. 13/026,650 dated Nov. 9, 2012.
Office Action for U.S. Appl. No. 13/026,692 dated Nov. 9, 2012.
Office Action for U.S. Appl. No. 13/026,752 dated Nov. 9, 2012.
Office Action for U.S. Appl. No. 13/026,656 dated Nov. 13, 2012.
Office Action for U.S. Appl. No. 13/026,704 dated Nov. 23, 2012.
Office Action for U.S. Appl. No. 13/397,673, dated Dec. 18, 2012.
Office Action for U.S. Appl. No. 13/026,840, dated Dec. 31, 2012.
Office Action for U.S. Appl. No. 13/026,852, dated Jan. 14, 2013.
Restriction Requirement for U.S. Appl. No. 13/026,835, dated Dec. 12, 2012.
Notice of Allowance for U.S. Appl. No. 13/026,717, dated Feb. 12, 2013.
Office Action for U.S. Appl. No. 13/471,704, dated Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, dated Feb. 20, 2013.
Notice of Allowance for U.S. Appl. No. 13/026,783, dated Mar. 4, 2013.
Notice of Allowance for U.S. Appl. No. 13/026,692, dated Mar. 15, 2013.
Notice of Allowance for U.S. Appl. No. 13/026,835, dated Mar. 20, 2013.
Notice of Allowance for U.S. Appl. No. 13/026,664, dated Apr. 22, 2013.
Notice of Allowance for U.S. Appl. No. 13/026,656, dated Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, dated Apr. 18, 2013.
Notice of Allowance for U.S. Appl. No. 13/026,704, dated Apr. 30, 2013.
Notice of Allowance for U.S. Appl. No. 13/026,852, dated May 10, 2013.
Notice of Allowance for U.S. Appl. No. 13/026,717, dated May 15, 2013.
Notice of Allowance for U.S. Appl. No. 13/471,704, dated May 22, 2013.
Notice of Allowance for U.S. Appl. No. 13/026,678, dated May 28, 2013.
Notice of Allowance for U.S. Appl. No. 13/026,650, dated May 30, 2013.
Restriction Requirement for U.S. Appl. No. 13/314,444, dated Jun. 7, 2013.
Restriction Requirement for U.S. Appl. No. 13/214,198, dated Jun. 13, 2013.

(56) References Cited

OTHER PUBLICATIONS

Notice of Allowance for U.S. Appl. No. 13/026,840, dated Jun. 13, 2013.
Restriction Requirement for U.S. Appl. No. 13/026,771, dated Jun. 13, 2013.
Notice of Allowance for U.S. Appl. No. 13/026,752, dated Jul. 1, 2013.
Restriction Requirement for U.S. Appl. No. 13/678,543, dated Jul. 8, 2013.
Office Action for U.S. Appl. No. 13/026,725, dated Jul. 19, 2013.
Notice of Allowance for U.S. Appl. No. 13/026,664, dated Jul. 22, 2013.
Notice of Allowance for U.S. Appl. No. 13/026,692, dated Jul. 23, 2013.
Notice of Allowance for U.S. Appl. No. 13/397,673, dated Jul. 30, 2013.
Notice of Allowance for U.S. Appl. No. 13/026,704, dated Aug. 2, 2013.
Notice of Allowance for U.S. Appl. No. 13/026,783, dated Aug. 5, 2013.
Office Action for U.S. Appl. No. 13/214,198, dated Aug. 6, 2013.
Office action for Chinese Patent Application No. 201110279954.7, dated Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, dated Sep. 9, 2013.
Office Action for U.S. Appl. No. 13/314,444, dated Sep. 9, 2013.
Office Action for U.S. Appl. No. 13/026,771, dated Sep. 9, 2013.
Notice of Allowance for U.S. Appl. No. 13/026,852, dated Sep. 18, 2013.
Office Action (Ex Parte) for U.S. Appl. No. 13/678,543, dated Sep. 20, 2013.
Office Action for U.S. Appl. No. 13/835,308, dated Sep. 27, 2013.
Notice of Allowance for U.S. Appl. No. 13/026,717, dated Oct. 1, 2013.
Office Action for U.S. Appl. No. 13/954,831, dated Oct. 1, 2013.
Notice of Allowance for U.S. Appl. No. 13/026,656, dated Oct. 4, 2013.
Office Action for U.S. Appl. No. 13/214,183, dated Oct. 25, 2013.
Chua, "Many Times Programmable z8 Microcontroller", e-Gizmo. cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, dated Nov. 15, 2013.
Notice of Allowance for U.S. Appl. No. 13/026,835, dated Nov. 22, 2013.
Notice of Allowance for U.S. Appl. No. 13/026,725, dated Dec. 10, 2013.
Office Action for U.S. Appl. No. 13/026,783, dated Dec. 23, 2013.
Notice of Allowance for U.S. Appl. No. 13/026,771, dated Jan. 15, 2014.
Office Action for Chinese Patent Application No. 201110244362.1, dated Sep. 29, 2013.
Office Action for Chinese Patent Application No. 201110235464.7, dated Oct. 8, 2013.
Office Action for Chinese Patent Application No. 201110244400.3, dated Nov. 5, 2013.
Office Action for Chinese Patent Application No. 201110244342.4, dated Oct. 31, 2013.
Restriction Requirement for U.S. Appl. No. 13/678,541, dated Feb. 28, 2014.
Notice of Allowance for U.S. Appl. No. 13/026,840, dated Mar. 6, 2014.
Notice of Allowance for U.S. Appl. No. 13/026,840, dated Mar. 10, 2014.
Notice of Allowance of U.S. Appl. No. 13/678,543, dated Dec. 13, 2013.
Notice of Allowance for U.S. Appl. No. 13/835,308, dated Mar. 14, 2014.
Notice of Allowance for U.S. Appl. No. 13/026,835, dated Mar. 14, 2014.
Notice of Allowance for U.S. Appl. No. 13/026,725, dated Mar. 31, 2014.
Notice of Allowance for U.S. Appl. No. 13/026,852, dated Mar. 20, 2014.
Notice of Allowance for U.S. Appl. No. 13/026,771, dated Mar. 18, 2014.
Final Office Action for U.S. Appl. No. 13/214,183, dated Apr. 17, 2014.
"Embedded Systems/Mixed C and Assembly Programming", Wikibooks, Aug 6, 2009, pp. 1-7.
Notice of Allowance for U.S. Appl. No. 13/761,097, dated Jul. 15, 2014.
Office Action for U.S. Appl. No. 13/571,797, dated Apr. 24, 2014.
Notice of Allowance for U.S. Appl. No. 13/590,044, dated Apr. 29, 2014.
Notice of Allowance for U.S. Appl. No. 13/954,831, dated May 27, 2014.
Notice of Allowance of U.S. Appl. No. 13/833,044, dated May 29, 2014.
Notice of Allowance for U.S. Appl. No. 13/761,048, dated Jun. 10, 2014.
Office Action for Taiwanese Patent Application No. 100129642, dated May 19, 2014 (with translation).
Office Action for U.S. Appl. No. 13/072,783, dated Nov. 7, 2013.
Notice of Allowance for U.S. Appl. No. 13/026,840, dated Jun. 24, 2014.
Notice of Allowance for U.S. Appl. No. 13/214,198, dated Jun. 23, 2014.
Notice of Allowance for U.S. Appl. No. 13/590,044, dated Jun. 23, 2014.
Ker et al., "MOS-bounded diodes for on-chip ESD protection in a 0.15-μ m shallow-trench-isolation salicided CMOS Process" International Symposium on VLSI Technology, Systems and Applications, 2003, 5 pgs.
Notice of Allowance for U.S. Appl. No. 13/840,965, dated Jun. 25, 2014.
Office Action for U.S. Appl. No. 13/970,562, dated Jun. 27, 2014.
Office Action for U.S. Appl. No. 13/835,308, dated Jun. 27, 2014.
Notice of Allowance for U.S. Appl. No. 13/288,843, dated Jul. 8, 2014.
Restriction Requirement for U.S. Appl. No. 13/678,539, dated Jul. 1, 2014.
Notice of Allowance for U.S. Appl. No. 14/231,413, dated Jul. 18, 2014.
Notice of Allowance for U.S. Appl. No. 13/590,044, dated Jul. 23, 2014.
Restriction Requirement for U.S. Appl. No. 13/833,067, dated Jul. 11, 2014.
Notice of Allowance for U.S. Appl. No. 13/954,831, dated Aug. 4, 2014.
Restriction Requirement for U.S. Appl. No. 13/678,544, dated Aug. 1, 2014.
Notice of Allowance for U.S. Appl. No. 13/761,097, dated Jul. 25, 2014.
Ex parte Quayle for U.S. Appl. No. 13/761,057, dated Aug. 8, 2014.
Final Office Action for U.S. Appl. No. 13/314,444, dated May 14, 2014.
Corrected Notice of Allowability for U.S. Appl. No. 13/288,843, dated Aug. 19, 2014.
Office Action for U.S. Appl. No. 13/590,049, dated Aug. 29, 2014.

(56) References Cited

OTHER PUBLICATIONS

Ex Parte Quayle for U.S. Appl. No. 13/590,047, dated Aug. 29, 2014.
Ex Parte Quayle for U.S. Appl. No. 13/590,050, dated Sep. 3, 2014.
Office Action for U.S. Appl. No. 13/678,544, dated Sep. 12, 2014.
Office Action for U.S. Appl. No. 13/678,539, dated Sep. 10, 2014.
Notice of Allowance for U.S. Appl. No. 13/288,843, dated Sep. 18, 2014.
Notice of Allowance for U.S. Appl. No. 13/761,057, dated Sep. 26, 2014.
Notice of Allowance for U.S. Appl. No. 13/833,044, dated Sep. 24, 2014.
Notice of Allowance for U.S. Appl. No. 13/314,444, dated Sep. 24, 2014.
Office Action for U.S. Appl. No. 13/761,045, dated Sep. 30, 2014.
Notice of Allowance for U.S. Appl. No. 13/835,308, dated Oct. 10, 2014.
Notice of Allowance for U.S. Appl. No. 13/571,797, dated Oct. 14, 2014.
Office Action for U.S. Appl. No. 13/833,067, dated Oct. 20, 2014.
Notice of Allowance for U.S. Appl. No. 14/085,228, dated Oct. 23, 2014.
Office Action for U.S. Appl. No. 13/842,824, dated Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, dated Nov. 25, 2014.
Notice of Allowance for U.S. Appl. No. 13/590,047, dated Nov. 24, 2014.
Office Action for U.S. Appl. No. 13/590,044, dated Dec. 9, 2014.
Notice of Allowance for U.S. Appl. No. 13/590,050, dated Dec. 18, 2014.
Office Action for U.S. Appl. No. 14/042,392, dated Dec. 31, 2014.
Office Action for U.S. Appl. No. 14/071,957, dated Dec. 29, 2014.
International Search Report and Written Opinion for International Patent Application No. PCT/US/2014/056676, dated Dec. 19, 2014.
Office Action for U.S. Appl. No. 14/493,083, dated Jan. 8, 2015.
Office Action for Chinese Patent Application No. 2011102443903, dated Dec. 16, 2014 (with translation).
Notice of Allowance for U.S. Appl. No. 13/970,562, dated Jan. 23, 2015.
Notice of Allowance for U.S. Appl. No. 14/493,069, dated Feb. 17, 2015.
Notice of Allowance for U.S. Appl. No. 14/085,228, dated Feb. 18, 2015.
Notice of Allowance for U.S. Appl. No. 13/761,045, dated Feb. 18, 2015.
Notice of Allowance for U.S. Appl. No. 14/231,404, dated Jan. 22, 2015.
Notice of Allowance for U.S. Appl. No. 14/021,990, dated Dec. 9, 2014.
Final Office Action for U.S. Appl. No. 13/678,544, dated Feb. 15, 2015.
Office Action for U.S. Appl. No. 14/101,125, dated Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, dated Mar. 5, 2015.
Final Office Action for U.S. Appl. No. 13/678,539, dated Apr. 1, 2015.
Office Action for U.S. Appl. No. 14/636,155, dated Apr. 10, 2015.
Notice of Allowance for U.S. Appl. No. 14/021,990, dated Apr. 14, 2015.
Notice of Allowance for U.S. Appl. No. 13,842,824, dated Apr. 14, 2015.
Notice of Allowance for U.S. Appl. No. 14/071,957, dated Apr. 14, 2014.
Notice of Allowance for U.S. Appl. No. 14/231,404, dated Apr. 17, 2015.
Notice of Allowance for U.S. Appl. No. 13/590,444, dated May 12, 2015.
Notice of Allowance for U.S. Appl. No. 13/072,783, dated May 13, 2015.
Notice of Allowance for U.S. Appl. No. 13/833,067, dated Jun. 5, 2015.
Office Action for U.S. Appl. No. 13/314,444, dated Dec. 10, 2014.
Final Office Action for U.S. Appl. No. 13/026,783, dated Jul. 30, 2015.
Notice of Allowance for U.S. Appl. No. 14/553,874, dated Aug. 10, 2015.
Office Action for U.S. Appl. No. 14/500,743, dated Aug. 17, 2015.
Notice of Allowance for U.S. Appl. No. 14/042,392, dated Aug. 21, 2015.
Office Action for U.S. Appl. No. 14/485,696, dated Aug. 20, 2015.
Notice of Allowance for U.S. Appl. No. 14/493,083, dated Aug. 27, 2015.
Office Action for U.S. Appl. No. 13/678,539, dated Sep. 16, 2015.
Office Action for U.S. Appl. No. 14/507,691, dated Oct. 30, 2015.
Final Office Action for U.S. Appl. No. 14/101,125, dated Nov. 17, 2015.
Notice of Allowance for U.S. Appl. No. 13/072,783, dated Oct. 27, 2015.
Office Action for U.S. Appl. No. 14/792,479, dated Aug. 28, 2015.
Notice of Allowance for U.S. Appl. No. 14/500,743, dated Dec. 2, 2015.
Notice of Allowance for U.S. Appl. No. 14/636,155, dated Dec. 4, 2015.
Notice of Allowance for U.S. Appl. No. 14/071,957, dated Dec. 4, 2015.
Notice of Allowance for U.S. Appl. No. 13/678,544, dated Feb. 12, 2016.
Office Action for U.S. Appl. No. 14/749,392, dated Feb. 25, 2016.
Office Action for U.S. Appl. No. 14/940,012, dated Feb. 26, 2016.
Notice of Allowance for U.S. Appl. No. 14/485,698, dated Mar. 1, 2016.
Notice of Allowance for U.S. Appl. No. 14/507,691, dated Mar. 15, 2016.
Final Office Action for U.S. Appl. No. 13/314,444, dated Dec. 8, 2011.
Final Office Action for U.S. Appl. No. 13/678,539, dated Apr. 8, 2016.
Notice of Allowance for U.S. Appl. No. 14/545,775, dated Apr. 12, 2016.
Final Office Action for U.S. Appl. No. 14/101,125, dated Apr. 21, 2016.
Notice of Allowance for U.S. Appl. No. 14/500,743, dated Apr. 26, 2016.
Notice of Allowance for U.S. Appl. No. 14/749,392, dated Jun. 27, 2016.
Notice of Allowance for U.S. Appl. No. 14/940,012, dated Jul. 15, 2016.
Office Action for U.S. Appl. No. 14/985,095, dated Jul. 21, 2016.
Notice of Allowance for U.S. Appl. No. 13/314,444, dated Aug. 5, 2016.
Notice of Allowance for U.S. Appl. No. 14/485,696, dated Sep. 21, 2016.
Notice of Allowance for U.S. Appl. No. 15,076,460, dated Dec. 5, 2016.
Final Office Action for U.S. Appl. No. 14/101,125, dated Dec. 14, 2016.
Office Action for U.S. Appl. No. 15/297,922, dated Dec. 23, 2016.
Office Action for U.S. Appl. No. 15/270,287, dated Dec. 23, 2016.
Final Office Action for U.S. Appl. No. 13/678,539, dated Feb. 8, 2017.
Notice of Allowance for U.S. Appl. No. 15/076,460, dated Mar. 15, 2017.
Office Action for U.S. Appl. No. 15/422,266, dated Mar. 17, 2017.
Office Action for U.S. Appl. No. 15/365,584, dated Apr. 21, 2017.
Notice of Allowance for U.S. Appl. No. 14/485,696, dated May 25, 2017.
Notice of Allowance for U.S. Appl. No. 14/101,125, dated Jul. 10, 2017.

(56) References Cited

OTHER PUBLICATIONS

Notice of Allowance for U.S. Appl. No. 15/076,460, dated Jul. 20, 2017.
Final Office Action for U.S. Appl. No. 14/485,698, dated Jul. 24, 2017.
Renewed Final Office Action for U.S. Appl. No. 14/485,698, dated Aug. 2, 2017.
Office Action for Taiwanese Patent Application No. 102145000, dated Jul. 7, 2017. (with translations).
Office Action for Chinese Patent Application No. 102610272 A, dated Jul. 10, 2017. (with translations).
Final Office Action for U.S. Appl. No. 15/422,266, dated Sep. 12, 2017.
Notice of Allowance for U.S. Appl. No. 15/365,584, dated Sep. 13, 2017.
Notice of Allowance for U.S. Appl. No. 14/485,698, dated Oct. 16, 2017.
Final Office Action for U.S. Appl. No. 15/422,266, dated Jan. 22, 2018.
Notice of Allowance for U.S. Appl. No. 14/485,698, dated Feb. 15, 2018.
Extended Search Report for EP Application No. 14901820, dated Jun. 23, 2017.
Office Action for U.S. Appl. No. 15/884,362, dated May 4, 2018.
Extended European Search Report for EP Application No. 18151106.4, dated Apr. 6, 2018.
Tonti, "Reliability, design qualification, and prognostic opportunity of in due E-Fuse" Prognostics and Heath Management IEEE Conference Jun. 20, 2011, pp. 1-7.
Office Action for U.S. Appl. No. 15/805,109, dated May 29, 2018.
Office Action for U.S. Appl. No. 14/485,698, dated Jun. 21, 2018.
Notice of Allowance for U.S. Appl. No. 15/884,362 dated Sep. 19, 2018.
Notice of Allowance for U.S. Appl. No. 15/708,116 dated Oct. 26, 2018.
Notice of Allowance for U.S. Appl. No. 14/485,698 dated Dec. 10, 2018.
Office Action for U.S. Appl. No. 15/953,422, dated Jan. 28, 2019.
Final Office Action for U.S. Appl. No. 15/953,422, dated May 14, 2019.
Office Action for U.S. Appl. No. 15/805,109, dated Jun. 26, 2019.
Office Action for U.S. Appl. No. 16/245,223, dated Aug. 8, 2019.
Notice of Allowance for U.S. Appl. No. 15/953,422, dated Sep. 5, 2019.
Notice of Allowance for U.S. Appl. No. 15/805,109, dated Nov. 27, 2019.
Office Action for U.S. Appl. No. 16/273,023, dated Nov. 27, 2019.
Notice of Allowance for U.S. Appl. No. 16/191,429 dated Dec. 9, 2019.
UK Office Action for UK 1605289.6 dated Nov. 19, 2019.

* cited by examiner

PROGRAMMABLE RESISTIVE MEMORY FORMED BY BIT SLICES FROM A STANDARD CELL LIBRARY

CROSS-REFERENCE TO RELATED APPLICATION

This application claims priority benefit of U.S. Provisional Patent Application No. 62/592,410, filed on Nov. 30, 2017 and entitled "PROGRAMMABLE RESISTIVE MEMORY FORMED BY BIT SLICES FROM A STANDARD CELL LIBRARY," which is hereby incorporated herein by reference.

BACKGROUND OF THE RELATED ART

Programmable Resistive Device (PRD) can be programmed into different resistance states and can retain data when the power supply of a memory is cut off. The memory can be used to permanent store data such as parameters, configuration settings, long-term data storage, etc. Similarly, this kind of memory can be used to store instructions, or codes, for microprocessors, Digital Signal Processors (DSPs), or microcontrollers (MCU), etc. PRD memory has three operations, read, write (or called program), and erase, for reading data, programming data, and erasing data before re-programming. PRD memory can be an EPROM, EEPROM, or flash memory that can be programmed from 10K to 100K times, or Multiple-Time Programmable (MTP) to be programmed from a few times to a few hundred times, or One-Time Programmable (OTP) to be programmed one time only. The PRD memory can also be emerging memories such as PCRAM (Phase Change RAM), RRAM (Resistive RAM), FRAM (Ferroelectric RAM), or MRAM (Magnetic RAM) that has at least one Magnetic Tunnel Junction (MTJ) in the cell.

One-Time-Programmable (OTP) is a particular type of PRD memory that can be programmed only once. An OTP memory allows the memory cells being programmed once and only once in their lifetime. OTP is generally based on standard CMOS processes and is usually embedded into an integrated circuit that allows each die in a wafer to be customized. There are many applications for OTP, such as memory repair, device trimming, configuration parameters, chip ID, security key, feature select, and PROM, etc.

FIG. 1 shows a conventional low-bit-count OTP memory 6. The OTP memory 6 has a shared pin 7 and a plurality of OTP cells that has a program pad 8 and an OTP element 5 for each cell. The OTP element is usually an electrical fuse that is fabricated from polysilicon, silicided polysilicon, or metal in CMOS processes. To program a fuse, a high voltage can be applied between the pad 8 and pad 7 to conduct a high current flowing through the OTP element 5 to break the fuse into a high resistance state. In 0.35 um CMOS, programming a polycide (i.e. polysilicon with silicide on top) fuse takes about 60 mA for 100 millisecond. The program current is so high that the other fuses in shared pins or the nearby interlayer dielectric can be damaged. The area for a one-pad-one-fuse OTP cell is also very large, about 150 um2, especially for low-pin-count chips.

FIG. 2(a) shows another conventional PRD cell 10. The PRD cell 10 has a PRD element 11 and a program selector 12. The PRD element 11 is coupled to a supply voltage V+ in one end and to a program selector 12 in the other end. The program selector 12 has the other end coupled to a second supply voltage V−. The program selector 12 can be turned on by asserting a control terminal Sel. The program selector 12 is usually constructed from a MOS device. The NVM element 11 is usually an electrical fuse based on polysilicon, silicided polysilicon, metal, a floating gate to store charges, or an anti-fuse based on gate oxide breakdown, etc.

FIG. 2(b) shows a PRD cell 15 using a diode as program selector, which is well suited for a low-bit-count PRD. The PRD cell 15 has a PRD element 16 and a diode as a program selector 17. The PRD element 16 is coupled to a supply voltage V+ in one end and a program selector 17 in the other. The program selector 17 has the other end coupled to a second supply voltage V− as a select signal Sel. It is very desirable for the program selector 17 being fabricated in CMOS compatible processes. The program selector 17 can be constructed from a diode that can be embodied as a junction diode with at least one P+ active region on an N well, or a diode with P+ and N+ implants on two ends of a polysilicon substrate or active region on an insulated substrate. The PRD element 16 is commonly an electrical fuse based on polysilicon, silicided polysilicon, metal, CMOS gate material, or anti-fuse based on gate oxide breakdown.

FIG. 3 shows a portion of a block diagram of a 1K×8 PRD memory 50 that has a memory array 51, X-decoders 52, Y-decoder 53, sense amplifiers 54, output latch 55, output multiplexer (MUX) 56, and control logic 57. The PRD memory cells depending on a floating-gate to store charges or rupture the oxide to create different logic state are very hard to fabricate and sensitive to process variation that require high voltage to program. Therefore, there are some high voltage circuits and charge pumps in the peripherals. These kinds of PRD memory need custom design, which is very time consuming and costly.

Conventional architecture, logic, and circuit designs for PRD memory are relatively complex and are not able to effectively generate low-bit-count PRD in standard cell libraries. Accordingly, there is a need for low-bit-count PRD designs and methods for generating PRD memory, such as OTP memory, in standard cell libraries.

SUMMARY

The invention relates to a low-bit-count Programmable Resistive Device (PRD) built in standard cell libraries through innovations in architecture, logic, circuit, and method. For example, in one embodiment, a low-bit-count PRD generated from standard cell libraries can have any bit counts from one bit to 256 bits or a few kilo-bits. The PRD memory can be applicable for device trimming, calibration, configuration settings, parameter storage, security key, product feature select, chip ID, MCU code memory, or the like.

As the semiconductor device geometry scaled beyond 28 nm, there are lots of local and global device and process variations. The device parameter variations can affect circuit performance widely, such that performance metrics will be hard to achieve, for example power and speed trade-off. If the device variations can be characterized for each chip and stored into an on-chip OTP memory, each chip can be optimized for better performance. For example, an SRAM designed in very advanced nodes tends to pulse the word line (WL) for a short time to cut down the power. The WL pulse width depends on the speed of this SRAM. The longer the WL pulse, the better for slower SRAM but the more the power consumption. If each SRAM can be characterized to determine the maximum WL pulse and programmed into an on-SRAM or on-chip OTP, the SRAM can be optimized for better speed and power. In another embodiment of designing SOI that has back-gate bias to tune speed and power. Each chip in SOI processes can be characterized with proper Forward Back Bias (FBB) or Reversed Back Bias (RBB) and programmed the bias voltage into the on-chip OTP to optimize the speed and power. Each macro in a chip or each basic SRAM unit in an SRAM can have its own OTP built-in using standard cell libraries to tune its performance individually. As a result, building OTP macros in standard cell library along with other logic blocks by using standard logic design flows can optimize the performance, be very ease to use and be cost effective. Other than the above two examples, OTP macros can be used for other kinds of performance tuning and/or device trimming in other embodiments and is more desirable to build into the same circuit blocks. Other than global or local performance tuning or device trimming, OTP can also be used as security keys. If the keys are built by standard cell library in random logic, the keys will be very secured as tracking the circuit connectivity in random logic are extremely difficult to hack the keys.

To build PRD bit slices in standard cell library, the cells need to conform to the standard cell library design and layout formats and guidelines. It is very desirable to design critical circuits, such as memory cell, tree-decoders, or sense amplifiers, into basic cells (called leaf cells). It is also better to simplify the memory architecture and designs so that using the standard logic flow can be more effective.

In one embodiment, the PRD bit slices can be designed as self-contained cells that has fuse unit, sense amplifier/latch, program selector, and interface unit (to access the other bit cells) so that the bit slices can be tiled together to generate any arbitrary bit cells. It is very desirable to use latch-type of sense amplifier so that the same latch can be used for sensing and storing data. In one embodiment, each PRD bit cell can be constructed as a shift register so that the input data can be passed from the first bit cell to the subsequent bit cells. Essentially, there is only one PRD bit slice to be chained together to create any bits in a standard cell library. In another embodiment, the interface unit in the PRD bit cell has built-in decoder circuit so that the bit cells can be randomly accessed by address buffers, pre-decoders, decoders using other logic cells in the same standard cell library. In either way, the PRD bit cells need to fit into the standard cell library design and layout formats and guidelines, such as the layout requirements of cell height, cell width, routing channel orientation and positions, and port locations, etc.

In one embodiment in architecture and logic design, the PRD memory can be organized as a one-dimensional shift register. Reading a PRD cell can be by sensing a PRD element resistance and convert into a logic state in a latch. Programming a cell can be by selecting at least one PRD cells with data stored in the latch. The PRD cells can be programmed sequentially through a shift register, or randomly selected. In another embodiment in logic design, the low-bit-count PRD has a multi-purpose latch in each PRD cell that can (a) be initialized or loaded with any values, (b) sense PRD element resistance and store the sensed data, (c) select cells for programming, (d) receive data from the previous cell or from an input, and (e) pass data into the next PRD cell. In a program mode, the shift register allows data stored in the PRD bit cells being passed sequentially to the entire PRD cells as program select. In another embodiment, a counter or decoder circuits can be used to select bit cells for programming.

The invention can be implemented in numerous ways, including as a method, system, device, or apparatus (including graphical user interface and computer readable medium). Several embodiments of the invention are discussed below.

As a Programmable Resistive Device (PRD) memory integrated in an integrated circuit, one embodiment can, for example, include at least a plurality of PRD cells, where at least one of the PRD cells includes at least: a PRD element, a program selector, the PRD element is coupled to a first supply voltage line and to a second supply voltage line through the program selector, the program selector receiving at least one enable signal, and the PRD cell has at least one latch built-in as a sense amplifier. Further, the PRD memory can be built with replica of the PRD cell with limited other kinds of peripheral cells. Also, the PRD element can be configured to be programmable by applying voltages to the first supply voltage line, the second supply voltage line and/or the enable signal to change resistance of the PRD element into a different logic state.

As an electronics system, one embodiment can, for example, include at least a processor, and a PRD memory built by cells in a standard cell library operatively connected to the processor. The PRD memory includes at least a plurality of PRD cells for providing data storage. At least one of the PRD cells includes at least a PRD element and a program selector. The PRD element is coupled to a first supply voltage line and to a second supply voltage line through the program selector, the program selector receiving at least one enable signal. The PRD cell can have at least one latch built-in as a sense amplifier. The PRD memory can be built with replica of the PRD cell with limited other kinds of peripheral cells. The PRD element can be configured to be programmable by applying voltages to the first supply voltage line, the second supply voltage line and/or the enable signal to change resistance into a different logic state.

As a method for placing a PRD memory in an integrated circuit design, one embodiment can, for example, include placing a plurality of PRD cells into the integrated circuit design, where at least one of the cells comprising a plurality of PRD cells, and at least one of the PRD cells including at least a PRD element and a program selector. The PRD element can be coupled to a first supply voltage line and to a second supply voltage line through the program selector, the program selector receiving at least one enable signal. The PRD cell can have at least one latch built-in as a sense amplifier. The PRD memory can be built with replica of the PRD cell with limited other kinds of peripheral cells. The PRD element can be configured to be programmable by applying voltages to the first supply voltage lines, the second supply voltage line and the enable signal to change resistance of the PRD element into a different logic state.

As a One-Time Programmable (OTP) memory integrated in an integrated circuit, one embodiment can, for example, include: a plurality of OTP cells; and at least one of the OTP cells including at least an OTP element and a program selector. The OTP element can be coupled to a first supply voltage line and to a second supply voltage line through the program selector, and the program selector can receive at least one enable signal. The OTP cell can have at least one latch built-in as a sense amplifier. The OTP memory can be built with a plurality of the OTP cells with one or more peripheral devices. The OTP element can be configured to be programmable by applying voltages to the first supply voltage line, the second supply voltage lines and/or the enable signal to change resistance of the OTP element into a different logic state.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF EMBODIMENTS OF THE INVENTION

The invention relates to a Programmable Resistive Device (PRD) memory configured as bit slices and built from bit storage components in a standard cell library. The configuration can follow standard logic design rules.

In one embodiment, the PRD memory can be organized as a one-dimensional shift register. Reading a PRD bit-slice cell can be by sensing a PRD element resistance and storing the logic state in a latch in each cell. Programming a cell can be by selecting a cell depending on the data in the latch as an enable signal. The latches can be configured as a shift register, randomly selected or sequentially selected by decoders or a counter, so that each bit-slice cell can be selected for programming. In another embodiment in logic design, the low-bit-count PRD memory can have a multi-purpose latch in each PRD bit-slice cell. The PRD bit-slice cell can (a) be initialized or loaded with any values, (b) sense PRD element resistance and store the sensed data, (d) select cells for programming, (d) receive data from the previous cell or from an input, and (e) pass data into the next cell. Each PRD bit-slice cell can be built to fit into design and layout requirements of a standard cell library. Such requirements can pertain to such characterizations as: cell height, cell width, routing channels orientation and position, power/ ground bus width, orientation, position and metal schemes, and I/O port positions.

Figure 1:
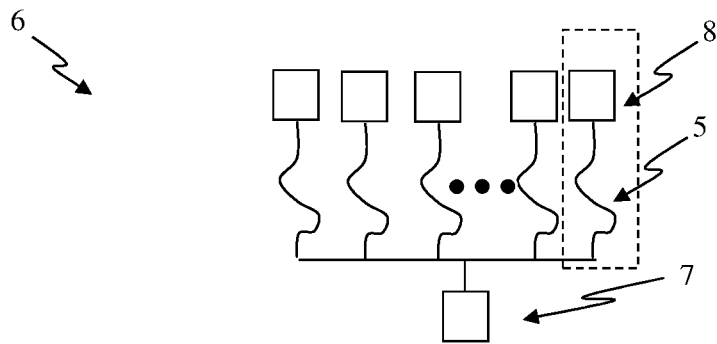
FIG. 1 shows a conventional OTP cell that has one pad for each fuse.
Figure 2A:
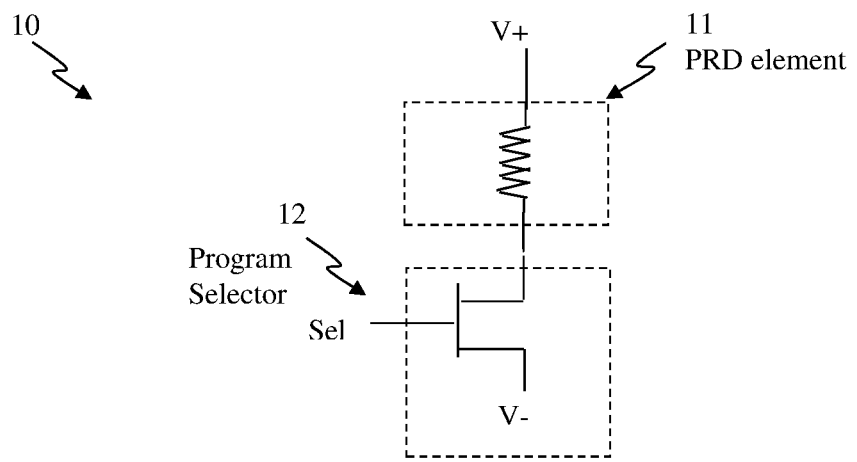
FIG. 2(a) shows a conventional PRD cell that has one PRD element and one MOS as program selector.
Figure 2B:
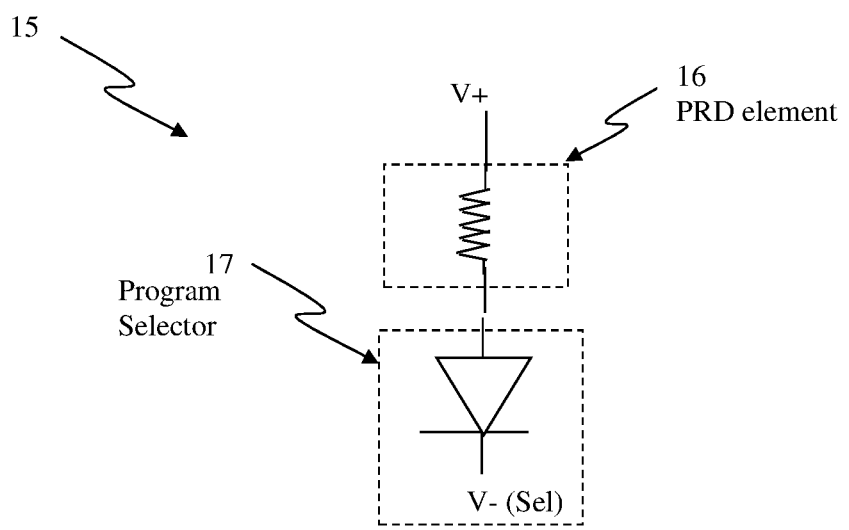
FIG. 2(b) shows a conventional PRD cell that has one PRD element and one diode as program selector.
Figure 3:
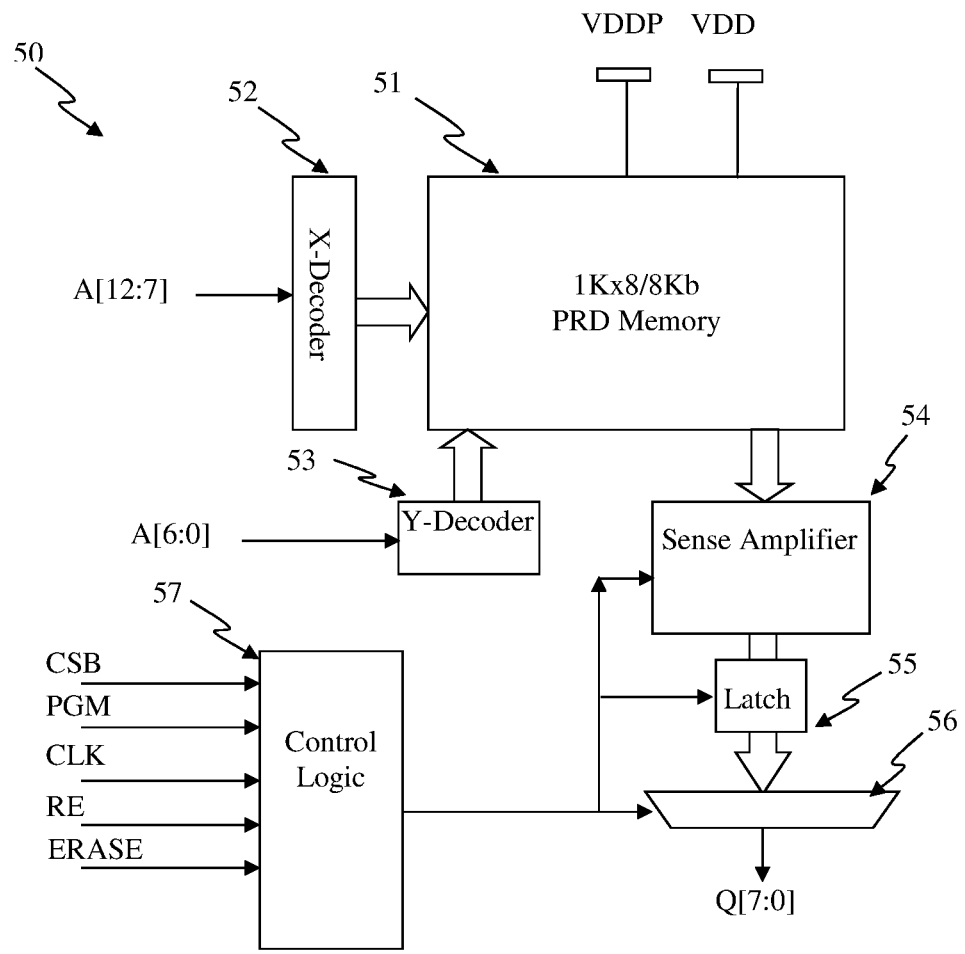
FIG. 3 shows a portion of a block diagram of conventional PRD memory that has at least one cell array, X-/Y-decoders, sense amplifiers, output latch, and control logic.

The conventional PRD memory as shown in FIG. 3 needs very high voltage or high current to program, which means that macros are always custom designed. The memory cells are very sensitive to process nodes and variations. However, if an OTP or PRD can be programmed below a critical current, the program current and voltage can be very low, almost in line with supply voltage for core logic or I/O devices, and the program current can be very low to be area efficient. Hence, the PRD memory can be very close to logic devices. As a result, the standard logic design flow can be applicable to generate PRD memory macros by using PRD memory bit-slice cells designed into a standard cell library. There are some associated issues to PRD memory architecture and circuit to simplify the designs so that the standard logic design flow can be more effective. Therefore, there are some concepts to be invented to make this innovation possible. In other words, low density PRD memory can be generated by using standard synthesis flow to generate any desirable PRD memory bits in any process by writing RTL codes and using standard cell libraries for placement and routing, just like any logic circuits.

A PRD memory program voltage can be reduced to near the core logic supply voltage and the program mechanism is based on accelerating normal wear out of logic devices, instead of explosive type of programming mechanisms. Advantageously, the PRD memory can be generated using standard cells, such as from a standard cell library.

Figure 4A:
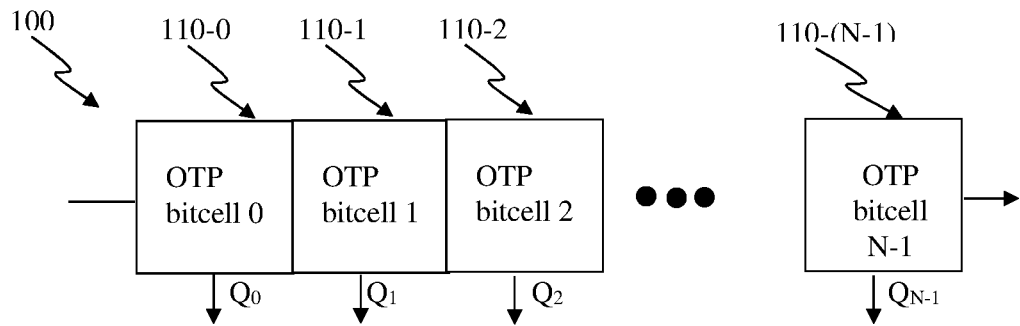
FIG. 4(a) shows an architecture of PRD memory built by bit slices in standard cell library in shift registers according to one embodiment of the present invention.

FIG. 4(a) shows a portion of a block diagram of a PRD memory 100 built from bit slices constructed as shift registers. The shift registers being available from a standard cell library. The shift registers have an arrangement to provide bit cell 0, 110-0, through bit cell N–1, 110-(N–1), according to one embodiment. The PRD memory 100 is built by tiling N PRD bit slices built in a standard cell library. The PRD memory 100 can be readily built with bit-slices coded by instantiating N bit-slices into RTL for synthesis, Placement and Routing (P&R). The first bit cell 0 can be slightly different from the other cells 1 through (N–1 ) because the first bit cell can have some common control logic, such as decoder, clock buffers or ESD protection. The number N of bit slices can be any number from 1 to 256, as an example. There can be repeater cells in every 8 or 16 bit slices, for examples, for buffering.

Figure 4B:
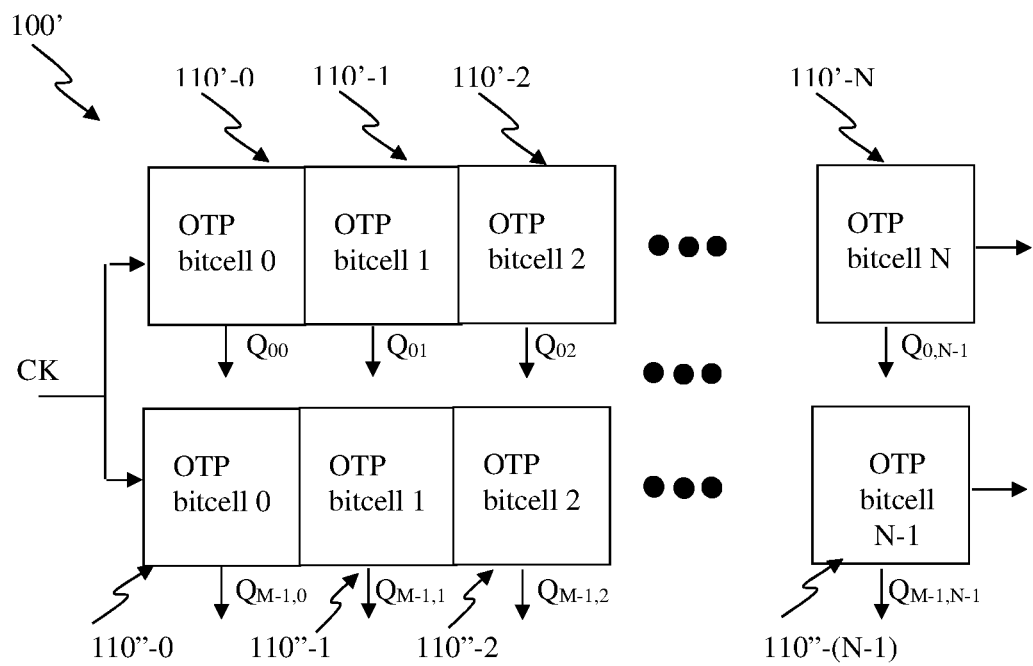
FIG. 4(b) shows an architecture of PRD memory built by bit slices in standard cell library in multiple chains of shifter registers according to another embodiment of the present invention.

FIG. 4(b) shows a portion of a block diagram of a PRD memory 100' built in standard cell library constructed as M channels of N shift registers each, corresponding to the shift registers in FIG. 4(a). Each shift register chain, for example, has N cells from 0, 110'-0, through N–1, 110'-(N–1), in the first chain; or N cells from 0, 110"-0, through N–1, 110"-(N–1), in the last chain. This configuration allows memory capacity expansion without extending beyond the shift register length, as a clock buffer is typically designed to drive a maximum cell. Each shift register chain can be built by tiling N PRD bit slices built from a standard cell library so that the memory can be readily coded by instantiating N bit-slices into RTL for syntheses and Placement and Routing (P&R). The first bit cell 0 in each shift register chain can be slightly different from the other cells 1 through (N–1) because the first bit cells can have some common control logic, such as decoder, clock buffers or ESD protection.

Figure 5A:
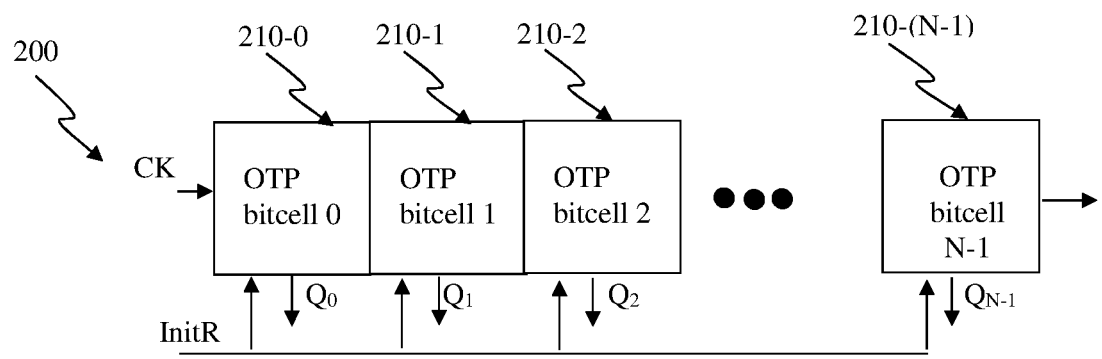
FIG. 5(a) shows a read operation of PRD memory built by bit slices in standard cell library according to one embodiment of the present invention.

FIG. 5(a) shows a portion of a block diagram of a read operation of a PRD memory 200 built in standard cell library constructed as shift registers, according to one embodiment. The memory 200 has cell 0, 210-0, through cell N–1, 210-(N–1). Reading the memory 200 can be enabled by asserting a signal InitR so that the PRD element can be sensed and to store the logic data in a latch in each bit cell. In another embodiment, some internal signals can be generated to read a group of cells upon asserting InitR sequentially. In yet another embodiment, a group of cells can be any number, such as 8 or 16, etc.

Figure 5B:
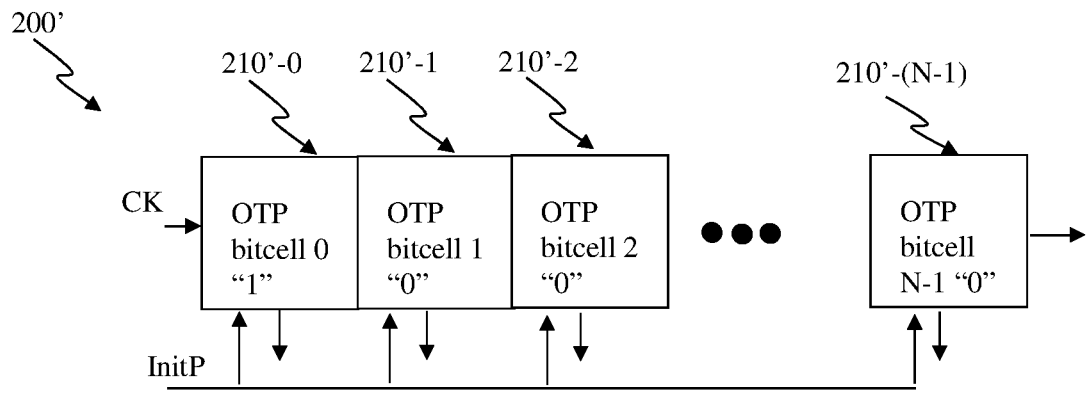
FIG. 5(b) shows a program initial operation of PRD memory built by bit slices in standard cell library according to one embodiment of the present invention.

FIG. 5(b) shows a portion of a block diagram of a program initialization operation of a PRD memory 200' built in standard cell library constructed as shift registers, according to one embodiment. The memory 200' has cell 0, 210'-0, through cell N–1, 210'-(N–1). Programming the memory 200'.can be initialized by asserting a signal InitP so that the latches in the cells can be loaded with 1 in the first cell and 0s in the other cells. The data initialized in the bit cells can be used as a program select to combine with a program signal PGM during programming. In another embodiment, the program initialization data can be shifted into the shift registers cells by cells.

Figure 5C:
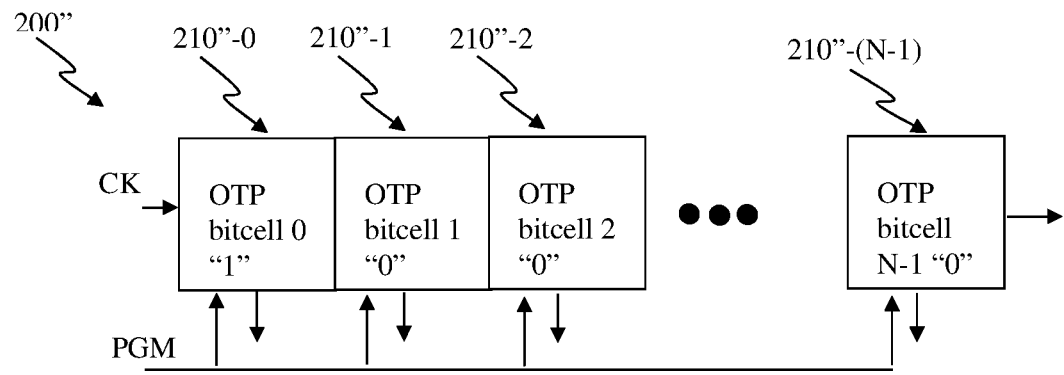
FIG. 5(c) shows an actual programming operation of PRD memory built by bit slices in standard cell library according to one embodiment of the present invention.

FIG. 5(c) shows a portion of a block diagram of an actual program operation of a PRD memory 200" built in standard cell library constructed as shift registers, according to one embodiment. The memory 200" has cell 0, 210"-0, through cell N–1, 210"-(N–1). The bit cells in memory 200".can be programmed by asserting a program signal PGM when the clock CK is high and the data in the cell has data 1. The cell data can be loaded with 1 in the first cell while the other cells are 0s and then the data 1 can be shifted to the subsequent cells when clock CK toggles so that every cell can be selected for programming.

Figure 5D:
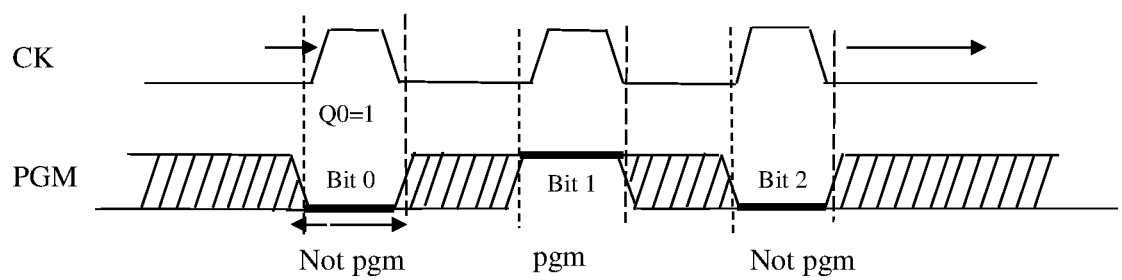
FIG. 5(d) shows a portion of a timing waveform during programming according to one embodiment of the present invention, corresponding to the schematics in FIG. 5(c).

FIG. 5(d) further shows a portion of a timing waveform of a program operation of a PRD memory 200' and 200" in FIGS. 5(b) and (5c), respectively, according to one embodiment. After the program initialization, the data in the first cell will be loaded with 1 while the data in other cells will be loaded with 0s. When the clock CK toggles, the data 1 in the first bit cell 0 will be shifted to the next cells and so on. If the signal PGM is set to 1, the bit cell with data 1 will be programmed during the CK high period, otherwise, the bit cells will not be programmed. In FIG. 5(d), the bit cells 0, 1, and 2, will not be programmed, programmed, and not programmed, respectively.

Figure 6A:
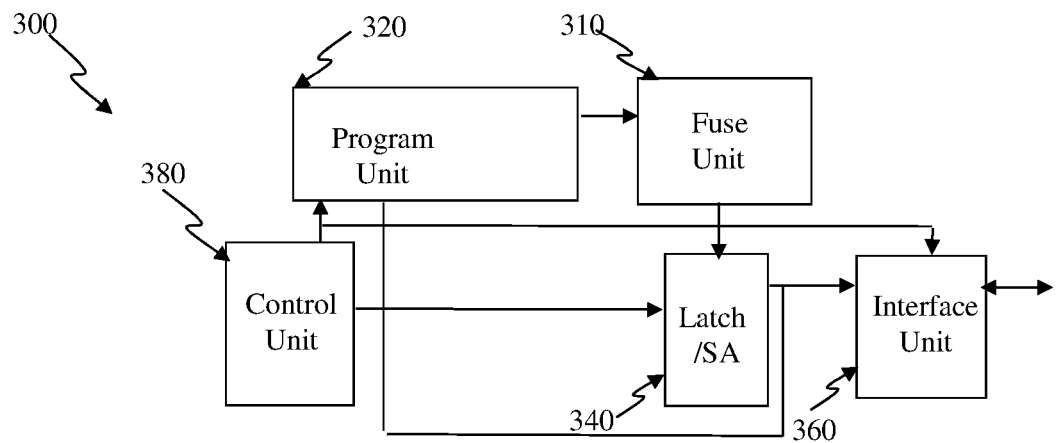
FIG. 6(a) shows a portion of a block diagram of PRD memory bit-slice cell built in standard cell library according to one embodiment of the present invention.

FIG. 6(a) shows a portion of a schematic of the bit cells 300, corresponding to 100-0, 100'-0, and 100"-0 in FIGS. 5(a), 5(b), and 5(c), respectively, according to one embodiment. The bit cell 300 has a fuse unit 310 coupled to a latch/sense amplifier 340 and program unit 320. The bit cell 300 also have an interface unit 360 to interface with the previous, the next cells, or to be accessed randomly through decoders. The bit cell 300 can also have a control unit 380 that can have clock buffers, address buffers, decoders, ESD protection and others. The control unit 380 can be unique for the first bit cell 0 that has some common logic circuits to provide control functions, in one embodiment.

Figure 6B:
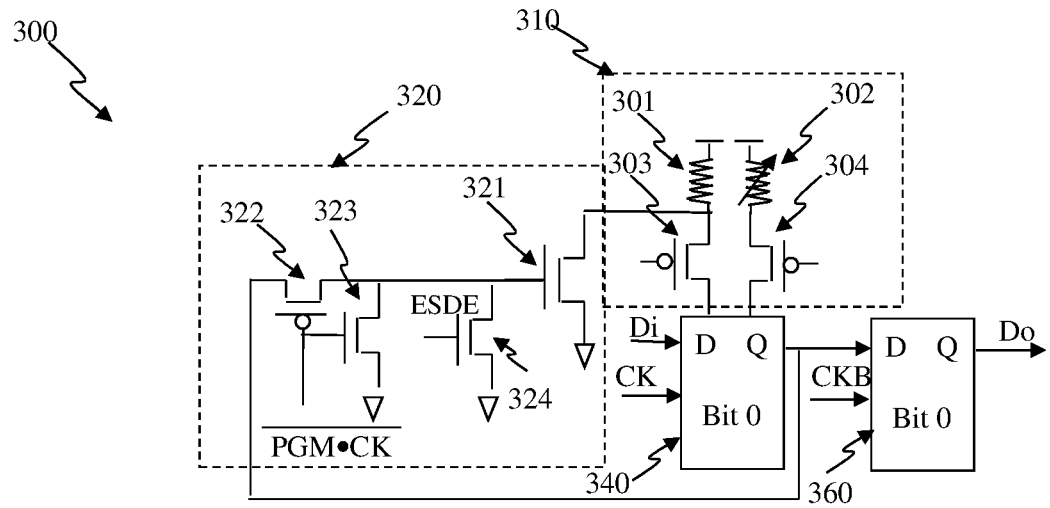
FIG. 6(b) shows a portion of circuits of PRD memory built by bit slices in standard cell library according to one embodiment of the present invention, corresponding to a block diagram in FIG. 6(a).

FIG. 6(b) shows a portion of a schematic bit cell of a PRD bit cell 300, corresponding to block diagram in FIG. 6(a), according to one embodiment. The bit cell 300 has a fuse unit 310 that has fuse element 301, reference resistor 302 that are coupled to a master latch 340 through input devices 303 and 304, respectively. The gates of the input devices 303 and 304 can be coupled to an enable signal. The master latch 340 has an output coupled to an input of a slave latch 360. The fuse unit 310 can be coupled to a program selector 321 in program unit 320. The program unit 320 also has control enable gates 322 and 323 to activate programming when the data in master latch 340 and input program signal PGM are both high during clock CK high period. An ESD selection device 324 can be used to disable the program select 321 when an ESD event happens. The ESD selection device 324 can, for example, include a MOS. The schematic in FIG. 6(b) is for illustrative purpose, there can be many different variations and yet equivalent embodiments and they all fall within the scope of this invention.

Figure 6C:
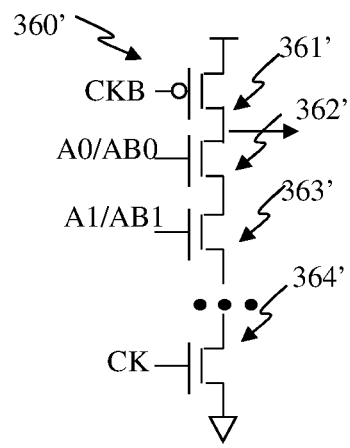
FIG. 6(c) shows a portion of a decoder circuit for PRD memory built by bit slices in standard cell library according to one embodiment of the present invention.

FIG. 6(c) shows a portion of a schematic of a tree decoder 360', corresponding to interface unit 360 in FIG. 6(a) according to another embodiment of the invention. The tree decoder 360' has a PMOS pull-up coupled to VDD and through NMOS 362', 363', and to 364" to ground. The gates of the PMOS 361', NMOS 36'2, 363' and 364' are coupled to CKB, address A0 or AB0, address A1 or AB1, and clock CK, respectively. There can be many NMOS stacked together to serve in a tree decoder with the gates coupled to addresses or pre-decoder outputs in different embodiments. Some internal nodes between the stacked NMOS can be shared with different tree decoders. In another embodiment, the NMOS 364' in the bottom of the tree decoder with gate coupled to CK can be omitted.

Figure 6D:
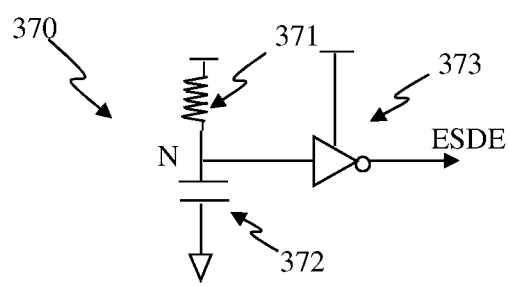
FIG. 6(d) shows a portion of ESD protection for PRD memory built by bit slices in standard cell library according to one embodiment of the present invention.

FIG. 6(d) shows a portion of a schematic of an ESD protection device 370 according to one embodiment. A power supply VPP for program pin can be coupled to a resistor 371. The other end of the resistor 371, node N, can be coupled to a capacitor 372 to VSS. The node N can be coupled to an input of an inverter 373. The output of the inverter 373 can be an ESD enable signal, corresponding to ESDE in FIG. 6(b). The node N is normally coupled to VPP so that the ESDE is low. However, during ESD zapping, the node N can be coupled to VSS through a large capacitor 372 so that the ESDE can be coupled high. This signal can be used to couple the gate of a program selector, such as MOS 324 in FIG. 6(b), to VSS, when ESD events happen. Thus accidental programming by ESD can be prevented.

Figure 7A:
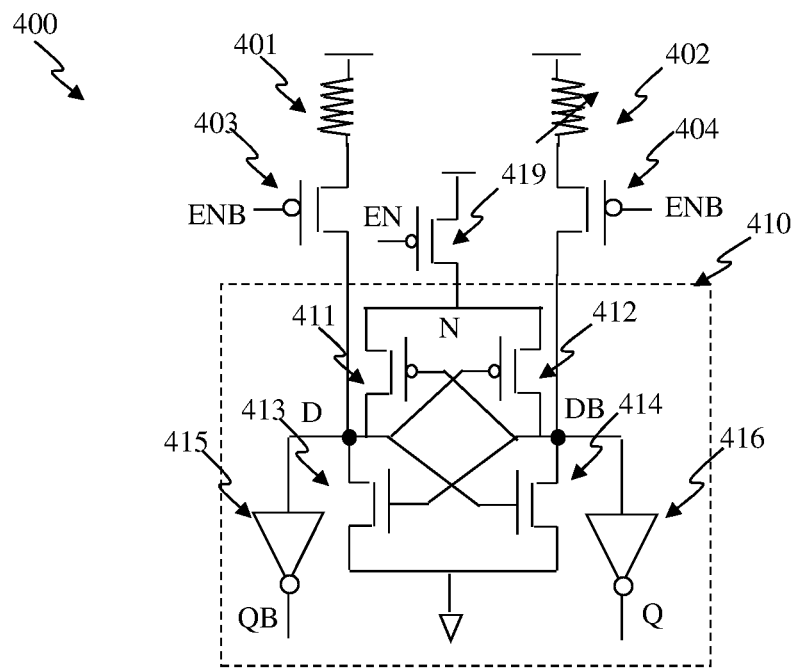
FIG. 7(a) shows a portion of schematics of a latch-type sense amplifier for a PRD cell built in standard cell library, according to one embodiment of the present invention.

FIG. 7(a) shows a portion of a schematic of a latch and a sense amplifier (SA) combined circuit 400, according to one embodiment. The latch and a sense amplifier (SA) combined circuit 400 includes a latch/SA 410 coupled to a PRD element block. The latch/SA 410 has a pair of cross-coupled inverters constructed by PMOS 411 and 412 and NMOS 413 and 414, with output nodes D and DB. The sources of NMOS 413 and 414 are coupled to VSS and the drains coupled to drains of PMOS 411 and 412, respectively. The sources of PMOS 411 and 412 are coupled to a node N. The node N is coupled to a PMOS 419 to VDD, where the gate of the PMOS 419 is coupled to an enable signal EN. The gates of PMOS 411 and NMOS 413 are coupled to the drains of PMOS 412 and NMOS 414, while the gates of PMOS 412 and NMOS 414 are coupled to the drains of PMOS 411 and NMOS 413. The two nodes D and DB are coupled to output QB and Q through inverters 415 and 416, respectively. The PRD element block has a PRD element 401 coupled to VDD and an input device 403. Similarly, a reference resistor 402 is coupled to VDD and another input device 404. The drains of the input devices 403 and 404 are coupled to the nodes D and DB, respectively, which are the internal nodes in the cross-coupled inverters in the latch/SA 410. The gates of the input device 403 and 404 are coupled to ENB.

Figure 7B:
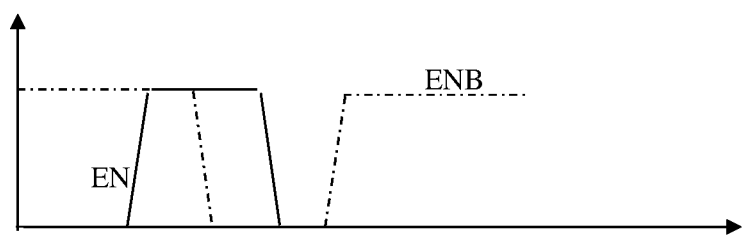
FIG. 7(b) shows a timing waveform of EN and ENB signals, corresponding to the schematics in FIG. 7(a), according to one embodiment of the present invention.

FIG. 7(b) shows a timing waveform to illustrate a sensing operation with respect to the latch and a sense amplifier (SA) combined circuit 400 in FIG. 7(a), according to one embodiment. Before sensing, EN is low and ENB is high so that the cross-coupled inverter built by MOS 411-414 is configured as the latch/SA 410. During sensing, EN goes high and ENB goes low so that the PRD element 401 and reference element 402 are coupled to the drains of NMOS 411 and 412, respectively. This constructs an R-NMOS latch by the PRD element 401, reference resistor 402, NMOS 413 and another NMOS 414 through input devices 403 and 404, respectively, while the PMOS 411 and 412 half latch is disabled. Some differential voltages will be developed in nodes D and DB accordingly. After the signals in DB and D are stable, EN can be pulled low and ENB high to enable another PMOS half-latch, constructed by PMOS 411 and 412, and to cutoff the input devices 403 and 404 so that the data in nodes D and DB can be latched without consuming any static current. In another embodiment, the input device 403 or reference input device 404 can be selectively turned on to load data "1" or "0" into the latch/SA 410, respectively.

Figure 8A:
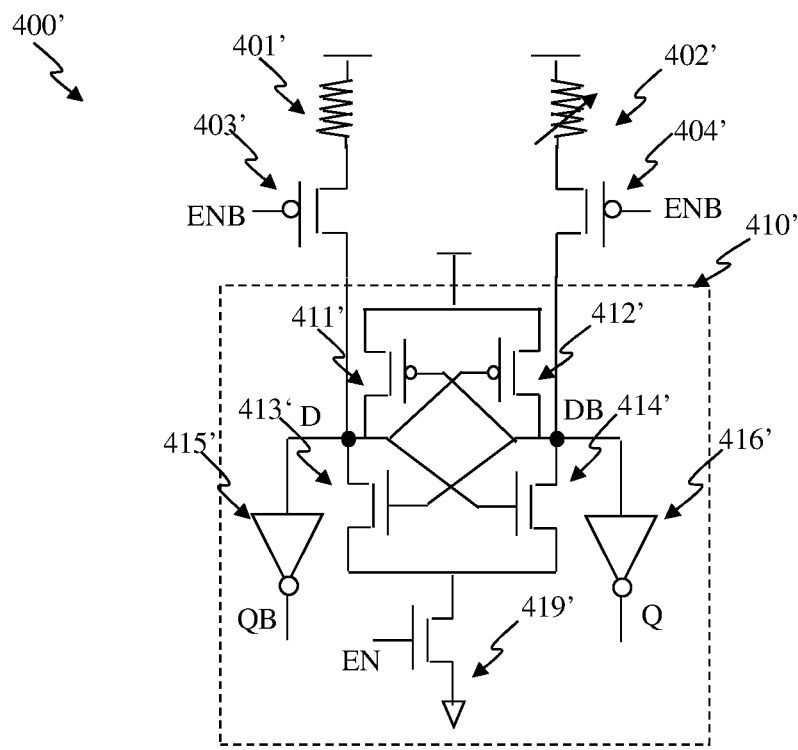
FIG. 8(a) shows a portion of schematics of a latch-type sense amplifier for a PRD cell built in standard cell library, according to another embodiment of the present invention.

FIG. 8(a) shows a portion of a schematic of a latch and a sense amplifier (SA) combined circuit 400', according to another embodiment. The latch and a sense amplifier (SA) combined circuit 400' is similar to the one in FIG. 7(a) except that the sources of the NMOS 413' and 414' are coupled to an NMOS 419' and to ground. The PRD element 401' and reference element 402' are coupled to the drains of PMOS 411' and 412' through PMOS input devices 403' and 404', respectively. The gates of the PMOS 403' and 404' are coupled to ENB. The latch/SA 410' has a pair of cross-coupled inverters consisting of PMOS 411' and NMOS 413' in one inverter and PMOS 412' and NMOS 414' in another inverter. The inverter output nodes are D and DB. The sources of NMOS 413' and 414' are coupled to VSS through an NMOS 419', while the drains are coupled to the drains of PMOS 411' and 412', respectively. The gate of NMOS 419' is coupled to EN, enable signal. The gates of PMOS 411' and NMOS 413' are coupled to the drains of PMOS 412' and NMOS 414'. The gates of PMOS 412' and NMOS 414' are coupled to the drains of PMOS 411' and NMOS 413'. Two inverters 415' and 416' are coupled to D and DB to generate outputs QB and Q, respectively. Before sensing, EN and ENB are both low. During sensing, EN goes high to enable an R-NMOS half latch constructed by NMOS 413' and 414' and PRD element 401' and reference resistance 402' through PMOS access devices 403' and 404', respectively. After the signals in D and DB are stable, ENB can be pulled high to eliminate the standby current and to enable the PMOS half latch. In another embodiment, the nodes D and DB can be pulled high by a pair of PMOS (not shown in FIG. 8(a)) and released when the NMOS 419' is enabled to activate the cross-coupled latch. In yet another embodiment, NMOS 403' or 404' can be selectively turn on during sensing to load data "0" or "1" into the latch/SA 410'

Figure 8B:
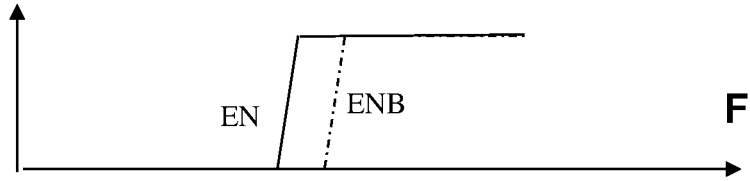
FIG. 8(b) shows a portion of timing waveform of EN and ENB corresponding to the schematics in FIG. 8(a), according to another embodiment of the present invention.

FIG. 8(b) shows a timing waveform of EN and ENB. Before sensing, both EN and ENB are low. During sensing, EN is high first to enable a resistor-NMOS half latch and then ENB is high to enable a full CMOS latch while turning off the PMOS access devices 403' and 404'.

The latch and a sense amplifier (SA) combined circuit 400 and 400' shown in FIGS. 7(a) and 8(a), respectively, are only for illustrative purposes. There can be many different variations of SA/latch designs that fall into the scope of this invention. For example, the PRD element and reference element inputs can be fed to the sources of PMOS, sources of NMOS, or drains of NMOS and PMOS. The input devices can be NMOS, PMOS, or full CMOS pass gate. The enable/disable device can be coupled to the sources of PMOS, sources of NMOS, or as an equalizer between the two latch nodes. The enable devices can be NMOS or PMOS devices. The NMOS and PMOS half-latches can be turned on in sequence. For example, the first stage of sensing can be cross-coupled inverters of resistor-NMOS or resistor-PMOS latches and then followed by another cross-coupled latched built by complement devices. The NMOS and PMOS half-latch can be turned on at the same time in different embodiment. The input devices can be turned off during latch enabling or after latch enabled. There are many variations and yet equivalent embodiments and they all fall within the scope of this invention.

Figure 9A:
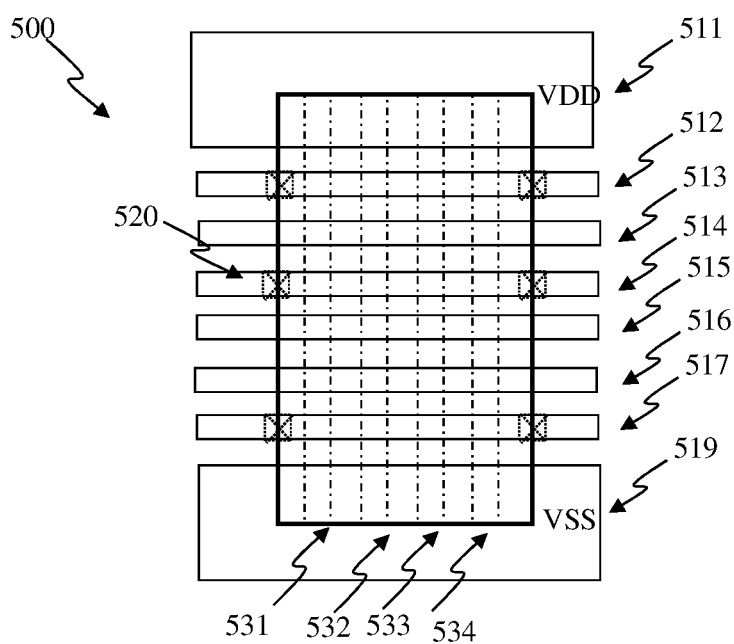
FIG. 9(a) shows a portion of PRD cell layout in a standard cell library, according to one embodiment of the present invention.

FIG. 9(a) shows a portion of layout of a PRD memory bit cell 500 built in standard cell library according to one embodiment of the invention. The bit cell 500 has a cell width and height confirmed to the multiple of grid sizes as in most standard cell library. The bit cell 500 has VDD and VSS rails 511 and 519, respectively, as defined in any standard cell library. Between VDD 511 and VSS 519, there can be many channels of metal routing 512 through 517, for example six (6) routing channels of metal-1. The metal-2 channels 531 to 534 can be running vertically. Normally, the even and odd layers of metal are running horizontally and vertically alternately. In most standard cell library design, up to metal-3 are used inside standard cells and the metal-4 and upper layers are allocated for global routing. The I/O ports, such as I/O port 520 and others, are normally placed near the cell boundary, allocated as input and output ports for interconnect between cells.

Figure 9B:
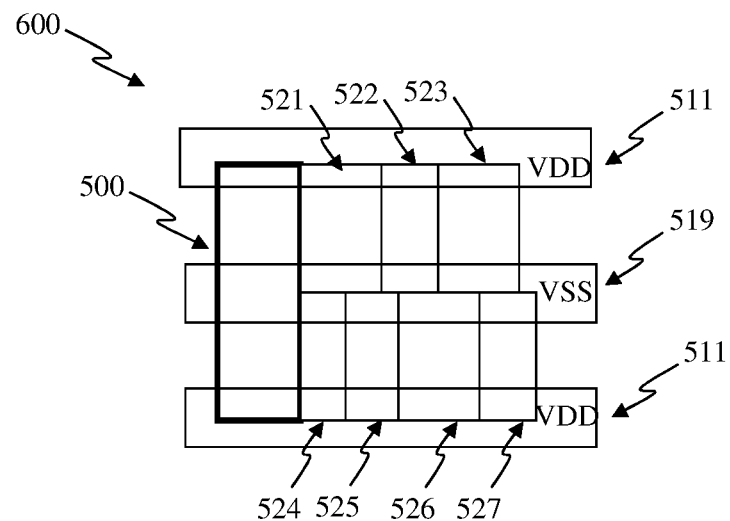
FIG. 9(b) shows a portion of PRD cell layout in a standard cell library that has twice as the cell height, according to one embodiment of the present invention.

In general, the PRD bit cells should be designed to confirm with the standard cell library design and layout formats. However, due to some special requirements for PRD memory, some exceptions may happen. For example, cell height needs to be larger than one standard cell height to accommodate a longer electrical fuse element. FIG. 9(b) shows a portion of standard cell layout 600 that has a PRD bit cell 500 placed among other standard cells such as 521-527. The PRD bit cell 500 in this example has twice in height as the other standard cells. To accommodate this special requirement, the standard cells can be placed back to back so that the common VSS 519 can be shared between two rows of standard cells, while the VDDs 511 are placed outside. This special requirement can be taken care of by writing constraint scripts to assist cell placements.

Figure 9C:
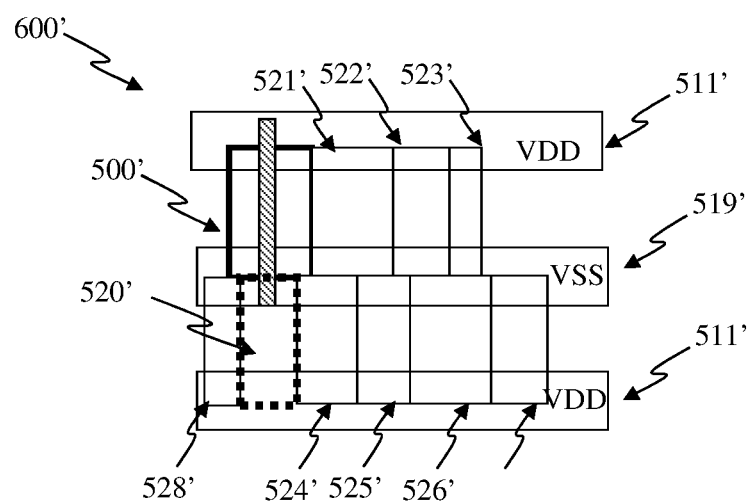
FIG. 9(c) shows a portion of PRD cell layout in a standard cell library that has a filler cell to solve a figure sticking out from a cell boundary, according to another embodiment of the present invention.

FIG. 9(c) shows another special condition where a feature, such as poly or metal, may stick out from a PRD bit cell. FIG. 9(c) shows a portion of a standard cell block 600' having a PRD bit cell 500' placed among other standard cells 521' through 528'. The PRD bit cell 500' has a polysilicon feature that extends beyond (or sticks out from) the standard cell boundary. This may happen for PRD elements that use an electrical fuse design that is longer than a standard cell height. To accommodate this condition, a script can be written to automatically put a filler cell 520' so that all cells can be placed seamlessly. The filler cell does not need to have any logic gates or transistors built in, but allow metal layers penetrate through.

FIGS. 9(b)-9(c) illustrate only a few layout conditions that slightly deviate from the standard cell library practices. To accommodate cell height and/or any features that might extend out of cell boundaries, synthesis or placement scripts can be utilized so that the tools for automated layout can consider those special conditions. However, bit-slice cells to construct PRD memory in standard cell library should follow standard cell guideline as much as possible. There are many variations and equivalent embodiments of synthesis and place and route techniques that can be applied to PRD memory built in standard cell library and they are all within the scope of this invention.

FIGS. 5(a)-9(c) only show a few of many possible embodiments of PRD memories built from a standard cell library. The number of PRD cells can vary. The PRD cells can be organized in one or two dimensional array physically to function as shift registers or randomly accessible memories. The numbers of row or column may vary in one or two dimensional array physically. The selector in a PRD cell can be a MOS, diode, or bipolar device. There can be a single or a plurality of sense amplifiers to sense a single or a plurality of cells simultaneously. The sense amplifiers can be activated more than one bit once to sense more bits by a Power-On Reset (POR) signal or by a signal generated from internal or external of the PRD memories. The actual programming time can be during the CLK high or low periods. The reference resistance can be shared between adjacent cells to save area. There are many variations and equivalent embodiments for the PRD memory design and layout techniques in standard cell library and they are all deemed within the scope of this invention.

Figure 10A:
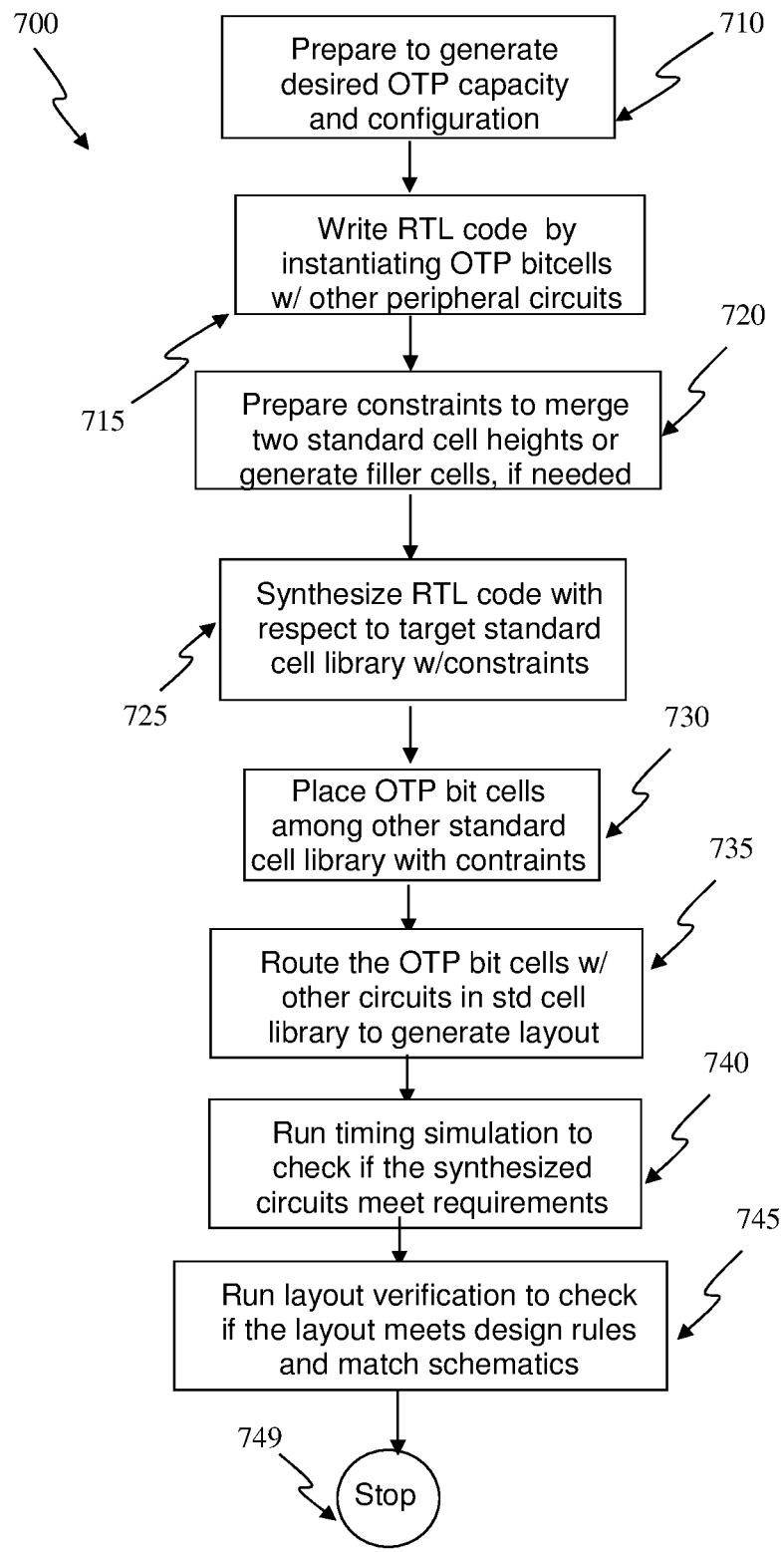
FIG. 10(a) shows a portion of flow chart to generate PRD memory in standard cell library, according to one embodiment of the present invention.

FIG. 10(a) shows a flow chart of a procedure 700 to generate PRD memories in a standard cell library, according to one embodiment. The procedure 700 starts by preparing a memory capacity and configuration to be generated in standard cell library in step 710. Next, writing a Register Transfer Level (RTL) file to build the desired PRD memories in step 715. This can be done by directly instantiating PRD bit-slice cells into the RTL or writing synthesizable RTL codes for peripheral. If the memory is built by shift registers, the former way can be more suitable. However, if the memory is built randomly accessible, the latter way can be more suitable. In any case, one approach is to design a bit cell and sense amplifier as a customized design built as basic cells in a standard cell library so that constructing the entire PRD memory can be easier. In step 720, prepare compiler directive or constraint scripts to assist synthesizing, placing, and routing the PRD memory. Some special conditions, such as larger cell height or filler cell insertion, can be taken care of by writing scripts, if needed. In step 725, synthesize the RTL code with a target standard cell library using compiler directive or constraints. In step 730, place the PRD cells with other peripheral circuits in standard cell library for automate layout generation. In step 735, route the PRD cells generated in standard cells with other standard cells to complete an entire circuit layout. In step 740, run timing simulations to check if the synthesized circuit meets the timing requirements. In step 745, run layout verifications to check if the layout meets the design rules and match schematics. Finally, if all checks finish successfully, the PRD memory is complete in step 749.

Figure 10B:
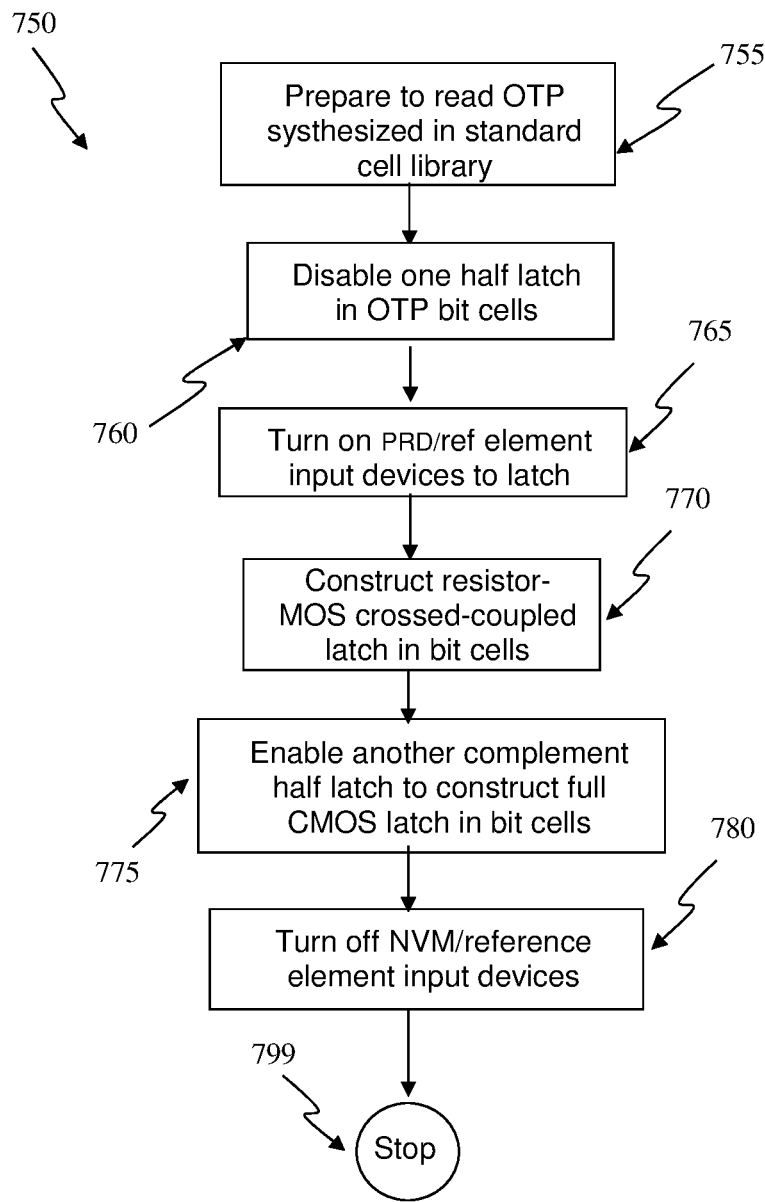
FIG. 10(b) shows a portion of flow chart to a read a PRD memory built in standard cell library, corresponding to the sense amplifier in FIG. 7(a), according to another embodiment of the present invention.

FIG. 10(b) shows a flow chart of a read procedure 750 for a PRD memory generated in standard cell library, corresponding to the schematics in FIG. 7(a), according to one embodiment. The procedure 750 starts by preparing to read and sense data of a PRD memory in step 755. To sense the resistance in a bit cell, firstly disable a half latch in step 760. Turn on the PRD element and reference element input devices to couple the PRD element and reference element to the latch in step 765. Turn on the half latch with the PRD element/reference element to construct a cross-coupled resistor-MOS inverter in step 770. This R-MOS latch is only an intermediate step to sense resistance because this circuit consumes DC current. When the signals in the latch nodes are stable, the other complement half latch can be turned on to constitute a full CMOS latch in step 775. Then, the input devices are turned off to disable coupling of the PRD element/reference element to the full CMOS latch to eliminate DC current in step 780. The PRD element resistance has thus been sensed, converted into logic state, and stored into the latch to complete the read procedure. Thereafter, the read procedure 750 stops in step 799. Reading PRD cells into the latch/SA can be achieved once for all bit cells or part of the bit cells at the same time sequentially. The read procedure 750 can be modified slightly for the latch/SA schematics in FIG. 8(a).

Figure 10C:
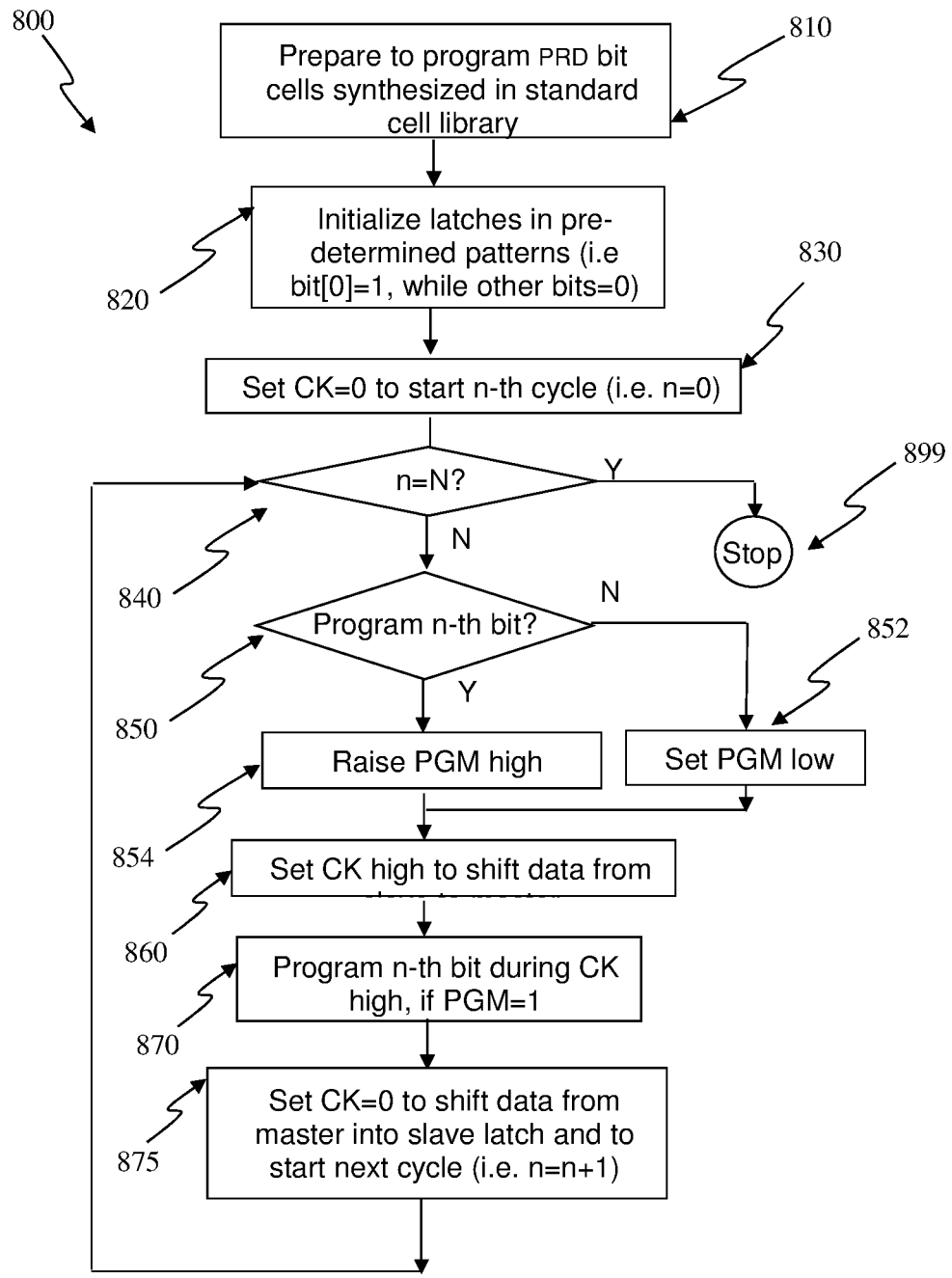
FIG. 10(c) shows a portion of flow chart to program a PRD memory built in standard cell library according to one embodiment of the present invention.

FIG. 10(c) shows a flow chart of a program procedure 800 for a PRD memory, generated in standard cell library, according to one embodiment. The procedure 800 starts by preparing program data with proper control signals, and applying supply voltages to the PRD memory generated in standard cell library in step 810. To select a cell in the PRD memory configured as shift registers for programming, the data in the cells are loaded with 1 in the first cell and all 0s in the rest of cells in step 820. Then set the clock CK low to start the 0-th cycle in step 830. Then, check if the current cycle is equal to the total bit count N in step 840. If so, stop the program procedure in step 899. If not, determine whether to program the n-th PRD cell in step 850. If yes, set the program enable signal PGM high in step 854. If not, setting PGM low in step 852. Following steps 852 and 854, set clock CK high in step 860 to load data into the master latch. Then, programming the n-th bit during CK high, if the PGM is high in step 870, otherwise nothing happens. After sufficient time for programming, the CK is set 0 to shift data from master to slave for the next cycle. Then, going back to step 840 to check if the last bit is reached.

Figure 10D:
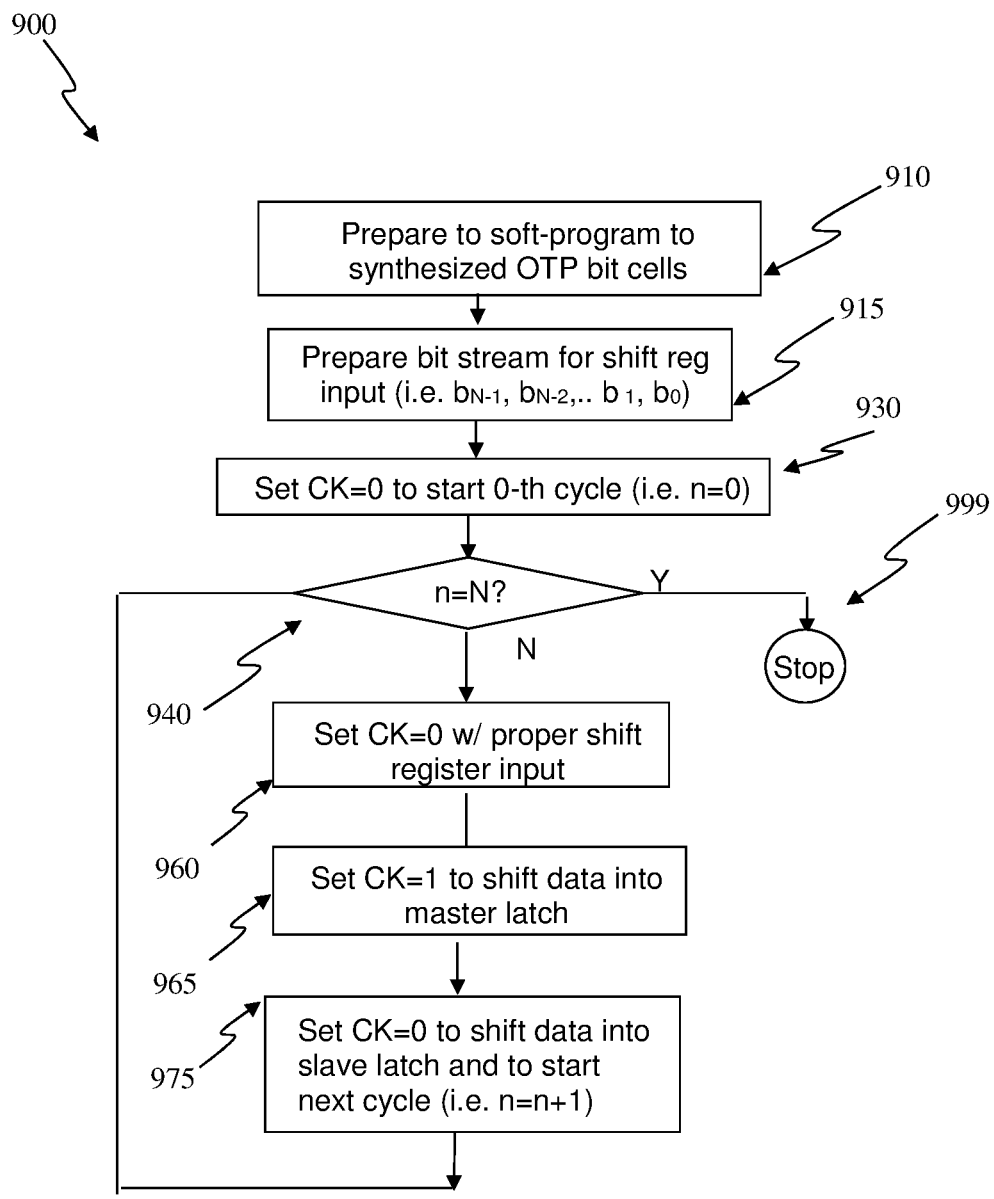
FIG. 10(d) shows a portion of flow chart to soft program a PRD memory built in standard cell library according to one embodiment of the present invention.

In most applications, PRD data are for device trimming, configuration or parameters storage, memory repair, or MCU code. It is desirable that data can be loaded into registers to test if the registers can function properly before actually programming. This technique is called soft program. FIG. 10(d) shows a flow chart of a soft-program procedure 900 for a PRD memory generated in standard cell library, according to one embodiment. The procedure 900 starts by preparing for soft programming a PRD memory having OTP bit cells generated in standard cell library in step 910. Then, prepare the bit stream as an input to shift registers in step 915. Then, set the clock CK low to start the 0-th cycle in step 930. Next, check if the current cycle is beyond the total bit count N in step 940. If so, stop the soft-program procedure in step 999. If not, set the clock CK low with proper shift register input at step 960. Set the clock CK high to shift data from the input or slave latch into the master latch in each PRD bit cell in step 965. Then, set the clock CK low to shift the data into slave latch for the next stage at step 975. Thereafter, go back to step 940 to check if all data have been shifted in.

The above discussions are for illustrative purposes. The block diagrams or schematics of the PRD cells shown in FIGS. 5(a)-9(b) are only a few of many possible embodiments. The logic gate and circuit implementation can vary for equivalent embodiments. The block diagrams of various shift registers, such as illustrated in FIGS. 5(a)-8(b), only exemplify different block diagram, schematics, and operation modes. The actual circuit and logic implementations may vary. The SA/latch shown in FIGS. 5(a)-8(b) only illustrates a few of many possible embodiments. Detailed circuit designs and implementations can vary. Similarly, the procedures described with respect to FIGS. 10(a)-10(d) are for exemplary embodiments. Various implementations for the procedures are available. For example, some steps of the procedures are not necessary and can be omitted. Some steps in the procedures can be performed in different order. There can be many different yet equivalent embodiments of the layout, circuit, logic, block diagram, and procedures and that they are still within the scope of this invention.

To further reduce the footprint, the PRD memory built in standard cell library can have a portion of the PRD cells built under a bonding pad of PGM, CK, VDD, VDDP (supply voltage for programming), or any pins in an integrated circuit, in the so-called Circuit-Under-Pad (CUP) technology. The auxiliary Electrostatic Discharge (ESD) protection can be integrated into the PRD memory built in standard cell library as well, particularly for VDDP pin.

Figure 11:
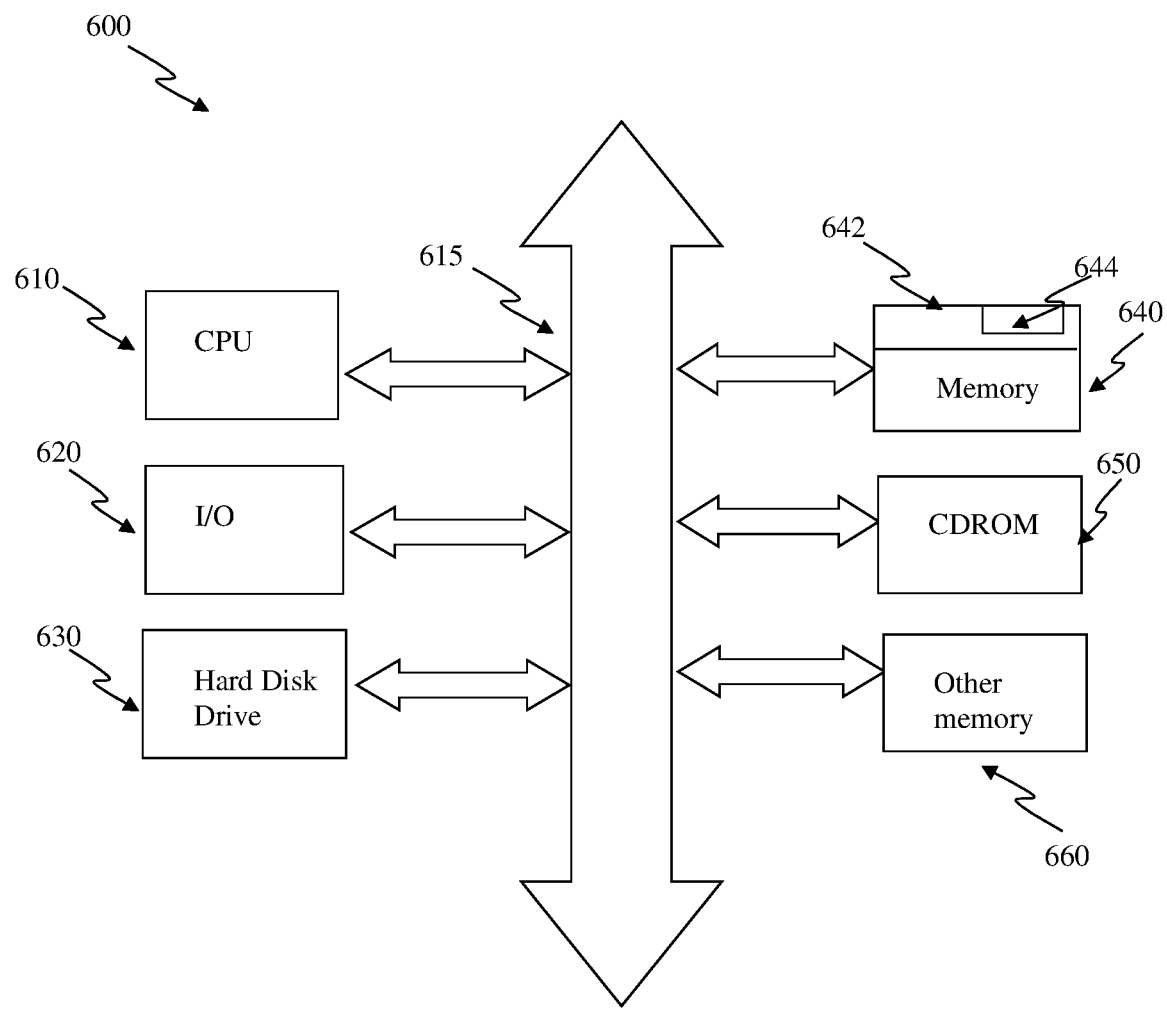
FIG. 11 shows a processor electronic system that employees at least one PRD memory built in the same standard cell library as other blocks in the same integrated circuit, according to one embodiment of the present invention.

FIG. 11 shows a processor electronic system 600 that employs at least one PRD memory built in standard cell library according to one embodiment. The processor system 600 can include at least one PRD cell 644, such as in a cell array 642, in at least one PRD memory 640. The PRD memory 640 can be built in standard cell library, according to one embodiment. The processor system 600 can, for example, pertain to an electronic system. The electronic system can include a Central Process Unit (CPU) 610, which communicates through a common bus 615 to various memory and peripheral devices such as I/O 620, hard disk drive 630, CDROM 650, standard-cell built PRD memory 640, and other memory 660. Other memory 660 is a conventional memory such as SRAM, DRAM, or flash, typically interfaces to CPU 610 through a memory controller. CPU 610 generally is a microprocessor, a digital signal processor, or other programmable digital logic devices. PRD memory 640 built in standard cell library is preferably constructed as an integrated circuit, which includes the memory array 642 having at least one programmable resistive device 644. The PRD memory 640 built in standard cell library typically interfaces to CPU 610 through a simple bus. If desired, the PRD memory 640 may be combined with CPU 610, in a single integrated circuit.

The invention can be implemented in a part or all of an integrated circuit, a Printed Circuit Board (PCB), or in an electronic system. The programmable resistive device memory built in standard cell library can be an OTP (One-Time Programmable), FTP (Few-Time Programmable), MTP (Multiple-Time Programmable), Charge-storing (floating-gate) nonvolatile memory, or emerging nonvolatile memory. The OTP can be fuse or anti-fuse, depending on the initial resistance state being low or high, respectively, and the final resistance is just the opposite. The fuse can include at least one of the silicided or non-silicided polysilicon, local interconnect, metal, metal alloy, metal-gate, polymetal, thermally isolated active area, FinFET device, extended source/drain in FinFET, contact, or via fuse. In a FinFET CMOS, the FinFET itself or the interconnect between fins can be programmable as a fuse. The anti-fuse can be a gate-oxide breakdown anti-fuse, contact or via anti-fuse with dielectrics in-between. The charge-storing nonvolatile memory can be EPROM, EEPROM, or flash memory. The emerging non-volatile memory can be Magnetic RAM (MRAM), Phase Change Memory (PCM), Conductive Bridge RAM (CBRAM), Ferroelectric RAM (FRAM), or Resistive RAM (RRAM). Though the program mechanisms are different, their logic states can be distinguished by different resistance values.

To find the suitable program ranges for those PRD cells built in standard cell libraries, a PRD program voltage can be calibrated by starting with a very low voltage to program a group of selected cells. The program voltage can be incremented until a voltage is reached that all cells selected to program can be programmed. This is the minimum program voltage. Further incrementing the program voltage until at least one programmed cells becomes unprogrammed or at least one unprogrammed cells becomes programmed. This is beyond the maximum program voltage. The suitable program voltage is between the minimum and the maximum voltage. The same procedure can be applied to find the erase voltage ranges.

This application hereby incorporates herein by reference U.S. Pat. No. 9,293,220, granted on Mar. 22, 2016 and entitled "Low-Bit-Count Non-Volatile Memory for 3D IC," which describes additional details on memory cells and programming thereof.

This application hereby also incorporates herein by reference U.S. Pat. No. 9,343,176, granted on Jul. 5, 2015 and entitled "Low-Bit-Count Non-Volatile Memory Interface With Soft Program Capability," which describes additional details on memory cells and programming thereof This application hereby also incorporates herein by reference U.S. Pat. No. 9,281,038, granted Mar. 8, 2016 and entitled "Low-Bit-Count Non-Volatile Memory Interface," which describes additional details on memory cells and programming thereof The above description and drawings are only to be considered illustrative of exemplary embodiments, which achieve the features and advantages of the invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A Programmable Resistive Device (PRD) memory integrated in an integrated circuit, the PRD memory comprising:
a plurality of PRD cells; and
at least one of the plurality of PRD cells including at least:
a PRD element,
a program selector,
the PRD element is coupled to a first supply voltage line and to the program selector, which is further coupled to a second supply voltage and/or one enable signal, and
the PRD cell has at least one latch built-in as a sense amplifier,
wherein the PRD cell is built from one or more basic cells in a standard cell library and follows standard cell design and layout guidelines associated with the standard cell library,
wherein the PRD cell has an interface unit coupled to the other PRD cells,
wherein the PRD memory is built with replica of the PRD cell with at least one peripheral cell and
wherein the PRD element can be configured to be programmable by applying voltages to the first supply voltage line, the second supply voltage line and/or the enable signal to change resistance of the PRD element into a different logic state.

2. The PRD memory as recited in claim 1, wherein the PRD cell is designed and laid out using the one or more basic cells and in compliance with standard cell design and layout guidelines associated with the standard cell library.

3. The PRD memory as recited in claim 1, wherein the at least one of the PRD cells are designed and laid out following the standard cell guidelines in at least one of the properties: cell width, cell height, orientation, width, position, and metal schemes of routing channels and input/output ports.

4. The PRD memory as recited in claim 1, wherein the at least one of the plurality of PRD cells has an integer multiple of standard cell height but still has the same routing channels when multiple standard cells are placed together.

5. The PRD memory as recited in claim 1, wherein the at least one of the plurality of PRD cells are placed and merged with the other standard cells with at least one filler cell.

6. The PRD memory as recited in claim 1, wherein the PRD memory is constructed as shift registers based on at least one PRD cells.

7. The PRD memory as recited in claim 1, wherein the at least one of the plurality of PRD cell in the PRD memory has at least one decoder for random accessibility.

8. The PRD memory as recited in claim 1, wherein a portion or all of the plurality of PRD cells can be read by asserting a read enable signal.

9. The PRD memory as recited in claim 1, wherein the at least one of the PRD cells can be selected for programming randomly.

10. The PRD memory as recited in claim 1, wherein the PRD memory stores data to tune the performance of an integrated circuit or trim device parameters in an integrated circuit.

11. The PRD memory as recited in claim 1, wherein the PRD element has at least one of the OTP element, RRAM thin film, PCRAM thin film, or MTJ in an MRAM.

12. The PRD memory as recited in claim 11, wherein the OTP element has at least one of the electrical fuse constructed from at least one of silicided polysilicon, silicide, local interconnect, metal, metal gate, thermally isolated silicon, FinFET, or interconnect between FinFET.

13. An electronic system, comprising:
a processor; and
a PRD memory operatively connected to the processor, the PRD memory includes at least a plurality of PRD cells for providing data storage, at least one of the plurality of PRD cells comprising:
a PRD element,
a program selector,
the PRD element is coupled to a first supply voltage line and to the program selector, which is further coupled to a second supply voltage and/or one enable signal, and
the PRD cell has at least one latch built-in as a sense amplifier,
wherein the PRD cell is built from basic cell in a standard cell library and in accordance with design and layout guidelines of the standard cell library,
wherein the PRD cell has at least one interface unit coupled to the other PRD cells, and
wherein the PRD element is configured to be programmable by applying voltages to the first supply voltage line, the second supply voltage line and/or the enable signal to change resistance into a different logic state.

14. The electronic system as recited in claim 13, wherein the PRD cell is designed and laid out design and layout guidelines with respect to at least one property selected from the group of: cell width, cell height, orientation, width, position, and metal schemes of routing channels and input/output ports.

15. The electronic system as recited in claim 13, wherein the PRD element has at least one of the OTP element, RRAM thin film, PCRAM thin film, or MTJ in an MRAM.

16. The electronic system as recited in claim 15, wherein the OTP element has at least one electrical fuse.

17. A method for placing a PRD memory in an integrated circuit design, the method comprising:
placing a plurality of cells into the integrated circuit design, at least one of the cells comprising a plurality of PRD cells, and at least one of the PRD cells including at least:
a PRD element, a program selector, at least one sense amplifier, and at least one interface unit,
the PRD element being coupled to a first supply voltage line and to the program selector,
the program selector being coupled to a second supply voltage and/or one enable signal, and
the at least one interface unit being coupled to the other PRD cells,
wherein the PRD element is built from one or more basic cells in a standard cell library while following design and layout guidelines associated with the standard cell library; and
wherein the PRD element is configured to be programmable by applying voltages to the first supply voltage lines, the second supply voltage line and/or the enable signal to change resistance of the PRD element into a different logic state.

18. A method as recited in claim 17, wherein the PRD element is designed and laid out following the design and layout guidelines, including compliance with at least one of: cell height, cell width, orientation, metal scheme, or routing channel.

19. A method as recited in claim 17, wherein the generating the PRD memory includes at least one of: (a) writing an RTL code to generate the PRD memory, (b) synthesizing RTL code with at least one basic cell from the standard cell library, (c) placing the at least one basic cell obtaining from the standard cell library based on synthesized RTL code, and (d) routing the at least one basic cell to perform a desired function.

20. A method as recited in claim 17, wherein the PRD element includes at least one of: OTP element, RRAM thin film, PCRAM thin film, or Magnetic Tunnel Junction in an MRAM.

* * * * *